(12) United States Patent
Namazue et al.

(10) Patent No.: US 7,245,324 B2
(45) Date of Patent: Jul. 17, 2007

(54) IMAGE PICKUP APPARATUS FOR PHOTOGRAPHING AN OBJECT

(75) Inventors: Eriko Namazue, Tokyo (JP); Akihiko Nagano, Chiba (JP); Hideki Dobashi, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 795 days.

(21) Appl. No.: 10/375,170

(22) Filed: Feb. 28, 2003

(65) Prior Publication Data

US 2004/0004668 A1 Jan. 8, 2004

(30) Foreign Application Priority Data

Feb. 28, 2002 (JP) .............................. 2002-054018
Mar. 4, 2002 (JP) .............................. 2002-057579

(51) Int. Cl.
*H04N 5/225* (2006.01)
*H04N 9/07* (2006.01)

(52) U.S. Cl. ...................... 348/340; 348/336; 348/294; 257/436

(58) Field of Classification Search ...................... None
See application file for complete search history.

(56) References Cited

U.S. PATENT DOCUMENTS

| | | | | |
|---|---|---|---|---|
| 5,526,338 | A * | 6/1996 | Hasman et al. ................ | 369/94 |
| 6,879,340 | B1 * | 4/2005 | Chevallier ............. | 348/207.99 |
| 7,110,034 | B2 * | 9/2006 | Suda ...................... | 348/340 |
| 2002/0047891 | A1 * | 4/2002 | Miyazaki et al. ........... | 347/241 |
| 2003/0127647 | A1 * | 7/2003 | Street et al. .................. | 257/59 |
| 2003/0179457 | A1 * | 9/2003 | Dobashi et al. ............. | 359/619 |

FOREIGN PATENT DOCUMENTS

| | | |
|---|---|---|
| EP | 1 073 125 A2 | 1/2001 |
| EP | 1 107 316 A2 | 6/2001 |
| EP | 1 339 225 A2 | 8/2003 |
| JP | 03-152971 | 6/1991 |
| JP | 03152971 A | 6/1991 |
| JP | 10-154805 | 6/1998 |
| JP | 2000-66141 | 3/2000 |
| JP | 2001-160973 | 6/2001 |
| JP | 2001-237405 * | 8/2001 |
| JP | 2001237405 A | 8/2001 |
| JP | 2003-197886 * | 7/2003 |
| JP | 2003-243638 | 8/2003 |
| JP | 2003-243639 | 8/2003 |

OTHER PUBLICATIONS

European Search Report dated Dec. 19, 2006, issued in application No. 03 004 455.6-1235.

* cited by examiner

*Primary Examiner*—Lin Ye
*Assistant Examiner*—Hung Lam
(74) *Attorney, Agent, or Firm*—Fitzpatrick, Cella, Harper & Scinto

(57) ABSTRACT

An image pickup element comprising a plurality of pixels, each including a photoelectric conversion section and a wavelength selection section for transmitting to the photoelectric conversion section light of a predetermined wavelength range, wherein the wavelength selection section has a vertex, and wherein, for a pixel located in the peripheral portion of the image pickup element, the vertex of the wavelength selection section is located closer to the center of the image pickup element than to the center of the photoelectric conversion section.

1 Claim, 28 Drawing Sheets

FIG. 9

| LAYER | MATERIAL | BLUE [nm] | GREEN [nm] | RED [nm] |
|---|---|---|---|---|
| 11 | TiO2 |  | 63 | 29 |
| 10 | SiO2 |  | 95 | 88 |
| 9 | TiO2 | 78 | 126 | 58 |
| 8 | SiO2 | 99 | 95 | 88 |
| 7 | TiO2 | 67 | 63 | 58 |
| 6 | SiO2 | 101 | 95 | 88 |
| 5 | TiO2 | 67 | 63 | 58 |
| 4 | SiO2 | 101 | 95 | 88 |
| 3 | TiO2 | 67 | 126 | 58 |
| 2 | SiO2 | 101 | 95 | 88 |
| 1 | TiO2 | 61 | 63 | 29 |
| TOTAL |  | 742 | 977 | 731 |

FIG. 24

| LAYER | MATERIAL | BLUE (nm) | GREEN (nm) | RED (nm) |
|---|---|---|---|---|
| 11 | TiO2 |  | 63 | 29 |
| 10 | SiO2 |  | 95 | 88 |
| 9 | TiO2 | 78 | 126 | 58 |
| 8 | SiO2 | 99 | 95 | 88 |
| 7 | TiO2 | 67 | 63 | 58 |
| 6 | SiO2 | 101 | 95 | 88 |
| 5 | TiO2 | 67 | 63 | 58 |
| 4 | SiO2 | 101 | 95 | 88 |
| 3 | TiO2 | 67 | 126 | 58 |
| 2 | SiO2 | 101 | 95 | 88 |
| 1 | TiO2 | 61 | 63 | 29 |
| TOTAL |  | 742 | 977 | 731 |

IMAGE PICKUP APPARATUS FOR PHOTOGRAPHING AN OBJECT

BACKGROUND OF THE INVENTION

1. Field of the Invention

The present invention relates to an image pickup element used for photographing an object.

2. Related Background Art

FIG. 27 is a center cross-sectional view showing the structure of a general image pickup element that forms a color image, i.e., pixels constituting the image pickup element. A micro lens 101 condenses external light beams to increase light acquisition efficiency. Color filters 102 are used to separate the obtained light beams in accordance with their wavelengths, a filter for one of the primary colors, R (red), G (green) and B (blue), is provided for each pixel. In addition, complementary color filters using C (cyan), M (magenta) and Y (yellow) are also used as color filters. Conventionally, an image pickup technique has been widely employed whereby these pixels are arranged like a mosaic and luminance data and color data corresponding to the number of pixels are prepared in the succeeding signal process. The color filter array conventionally used for an image pickup element tends to be a Bayer array.

In FIG. 27, further provided are a silicon wafer 104; a photoelectric conversion section 103, for converting received light into charges; a Poly wiring layer 110, serving as a gate for controlling the charges produced by the photoelectric conversion section 103; and wiring layers 111 to 113, made of a metal such as aluminum.

However, this conventional example has the following problems. Generally, the photographic processing employed to obtain a preferable image characteristic includes a first process of forming an image of an object using an optical device; a second process of adjusting the object image to reduce a high frequency component in a spatial frequency property; a third process of photoelectrically converting into an electric signal the object image for which the spatial frequency property has been adjusted; and a fourth process of employing the spatial frequency to compensate for a response to the obtained electric signal. At this time, the optical image is sampled by an image pickup element having a definite number of pixels. In order to output a high-quality image, in accordance with the sampling theory, a frequency component equal to or higher than the Nyquist frequency inherent to the image pickup element must be reduced in the spatial frequency property of the optical image. The Nyquist frequency is ½ of the sampling frequency determined by the pixel pitches. Therefore, through the optimized process sequence, the optical image to be sampled is adjusted to obtain an optical image having a characteristic corresponding to the Nyquist frequency inherent to the image pickup element, so that a high-quality image can be obtained wherein aliasing distortion, i.e., moire, is not remarkable.

A modulation transfer function (MTF), which is the spatial frequency transmission characteristic of an image, is an evaluation value that can well represent the characteristic of the sharpness of a digital still camera or a video camera. Specific elements affecting the MTF are an image forming optical system which is an optical device, an optical low-pass filter which is used to limit the bandwidth of an object image, the shape of an opening formed in the photoelectric conversion area of the image pickup element, and a digital iris correction function. An MTF that represents a final, overall image characteristic is provided as a product of the MTFs of the individual elements. That is, only the MTFs for the first to the fourth processes must be obtained to calculate the product.

It should be noted, that since the digital filter process, which is the fourth process, is performed on an image that has already been sampled by the image pickup element, no consideration need be given for a high frequency that exceeds the Nyquist frequency.

Therefore, according to the configuration, wherein a frequency component equal to or higher than the Nyquist frequency, inherent to the image pickup element, is reduced in the spatial frequency characteristic of the optical image, the frequency component at the Nyquist frequency or higher is small in the MTF product obtained for the first process, for the second process and for the third process, but not for the fourth process. On the assumption that a still image will be viewed, as is the case for a digital still camera, consideration should be given to the fact that, when a response value at a frequency slightly lower than the Nyquist frequency is high, even though the frequency component higher than the Nyquist frequency remains small, an image having a higher resolution is formed more easily than when there is no high frequency component higher than the Nyquist frequency.

In the first process for forming an object image using the image forming optical system, generally, an optical aberration in the center of the screen is more easily corrected than is one on the periphery. In order to obtain a preferable image in the peripheral portion of the screen, an especially acceptable characteristic close to the diffraction limit MTF which is determined using the F number of an photographic lens, must be obtained for the center at the screen. This need has recently been magnified as the pixel size of image pickup elements has continued to be reduced. Therefore, for the image forming optical system, it should be assumed that the image forming optical system is an ideal lens having no optical aberration to consider an MTF.

Further, in an image pickup element where light-receiving openings having a width d are laid out with no intervening gap, since the widths of the light-receiving openings match the pixel pitches, the response value of the third process at the Nyquist frequency u=d/2 is quite high. For this reason, generally, the frequency component around the Nyquist frequency is trapped in the second process in order to reduce the total MTF around the Nyquist frequency.

In the second process, normally, an optical low-pass filter made of a material, such as rock crystal, having a birefringence characteristic is employed. Or instead, a diffraction grating of a phase type, described in Japanese Patent Application Laid-Open No. 2000-066141, may be employed.

A birefringence plate is so interposed in the optical path of the optical device that the optical axis of the plate is inclined parallel to the horizontal direction of the image-forming face, and an object image produced by an ordinary ray and an object image produced by an extraordinary ray are formed while being shifted horizontally and relative to each other by at a predetermined distance. The birefringence plate is used to trap a specified spatial frequency, since when the object images are shifted, a bright band and a dark band on the fringes of the spatial frequency are overlapped. The MTF that uses the optical low-pass filter is represented by the following equation (1):

$$R_2(u) = |\cos(\pi \cdot u \cdot \omega)| \qquad (1).$$

In this equation (1), $R_2(u)$ denotes a response, u denotes a spatial frequency for an optical image, and $\omega$ denotes an object image separation width.

When a birefringence plate having an appropriate thickness is selected, a response of zero can be obtained for the image pickup element at the Nyquist frequency. And when the diffraction grating is employed, an optical image need only be separated into a plurality of images by diffraction, and these images are overlapped at predetermined locations to obtain the same effects.

However, in order to fabricate a birefringence plate, a crystal such as rock crystal or lithium niobate must be grown and polished to reduce its thickness, and this greatly increases the processing costs. Further, since a very fine structure is required for the diffraction grating, this also increases the processing costs.

The usage efficiency of light will now be described. For example, for a CCD image pickup element, for which the pixels of primary color filters that are intended to provide high-quality color reproduction are arranged in a mosaic shape, R (red), G (green) and B (blue) optical filters are positioned, one by one, between the micro lens 2 and the photoelectric conversion area 3.

At this time, at a pixel for which a red optical filter is provided, only a red light is photoelectrically converted, and a blue light and a green light are absorbed by the optical filters and only produce heat. Similarly, for a pixel for which a green optical filter is provided, a blue light and a red light are not photoelectrically converted and only produce heat, and for a pixel for which a blue optical filter is provided, a green light and a red light are not photoelectrically converted and only produce heat. That is, for the individual pixels of a conventional color image pickup element, of the incident light flux, only light that can pass through a predetermined optical filter is photoelectrically converted and output as an electric signal, while light that can not pass through the predetermined optical filter and only produces heat is discarded.

FIG. 28 is a graph showing a spectral transmittance characteristic for the RGB color filters provided for the image pickup element. Actually, since for an infrared ray the transmittance is high, an infrared cut filter, for blocking wavelengths of 650 nm or higher, is additionally provided between the image pickup element and the pickup lens. And as is apparent from the graph, only about $1/3$ of the visible radiation produced by a pixel is effectively employed.

The usage efficiency will now be described in more detail for the individual RGB colors. The dimension ratio for the RGB pixels of the color image pickup element in the Bayer array in FIG. 28 is $1/4:2/4:1/4$, when the dimension of a unit constituting a regular array is defined as 1. Therefore, the rate for a green light, used when the total light quantity is defined as 1, is $1/3 \times 2/4 = 1/6$, which is a product of the term for the wavelength selection and the term for the dimension ratio. The usage rate for the red light and for blue light is $1/3 \times 1/4 = 1/12$. Since the total of the usage rates for three lights is $1/6 + 1/12 + 1/12 = 1/3$, in this case, as well as in the above case, the usage efficiency is $1/3$. When the total light quantity is defined as 1, $2/3 \times 2/4 = 1/3$ of the green light and $2/3 \times 1/4 = 1/6$ of the red light and of the blue light are not effectively employed.

An image pickup element that uses primary color filters has been employed; however, for an image pickup element that uses complementary color filters, about $1/3$ of the visible radiation is not photoelectrically converted, and is not effectively employed. As is described above, for the conventional single-chip image pickup element that uses either primary color filters or complementary color filters, the light usage efficiency is low because the image pickup plane is divided by the color filters.

SUMMARY OF THE INVENTION

It is, therefore, one objective of the present invention to provide an image pickup element that obtains appropriate optical low-pass effects and increases the usage efficiency of incident light.

To achieve this objective, according to one aspect of the invention, provided is an image pickup element comprising a plurality of pixels, each including a photoelectric conversion section and a wavelength selection section which transmits to the photoelectric conversion section light of a predetermined wavelength range, wherein the wavelength selection section has a vertex; and wherein, for a pixel located in the peripheral portion of the image pickup element, the vertex of the wavelength selection section is located closer to the center of the image pickup element than to the center of the photoelectric conversion section.

According to another aspect of the invention, an image pickup apparatus in which a micro lens condenses light from an object and a photoelectric conversion section receives the condensed light and converts the received light into an electric signal to obtain an image of the object, comprises:

a wavelength selection section, located between the micro lens and a refraction section, which selectively transmits light having a predetermined wavelength and reflects light having another wavelength; and a reflection section, located between the micro lens and the refraction section, which directs light reflected by the wavelength selection section toward an adjacent photoelectric conversion section, wherein light reflected by the reflection section forms an image on the wavelength selection section.

Other objectives and features of the present invention will become apparent during the course of the following presentation, prepared while referring to the drawings.

BRIEF DESCRIPTION OF THE DRAWINGS

FIG. 9 is a diagram showing the composition of a dichroic layer;

FIG. 24 is a diagram showing example thicknesses for the dichroic layer in FIG. 20;

DETAILED DESCRIPTION OF THE PREFERRED EMBODIMENTS

First Embodiment

A first embodiment of the present invention is shown in FIGS. 1 to 15.

Figure 1:
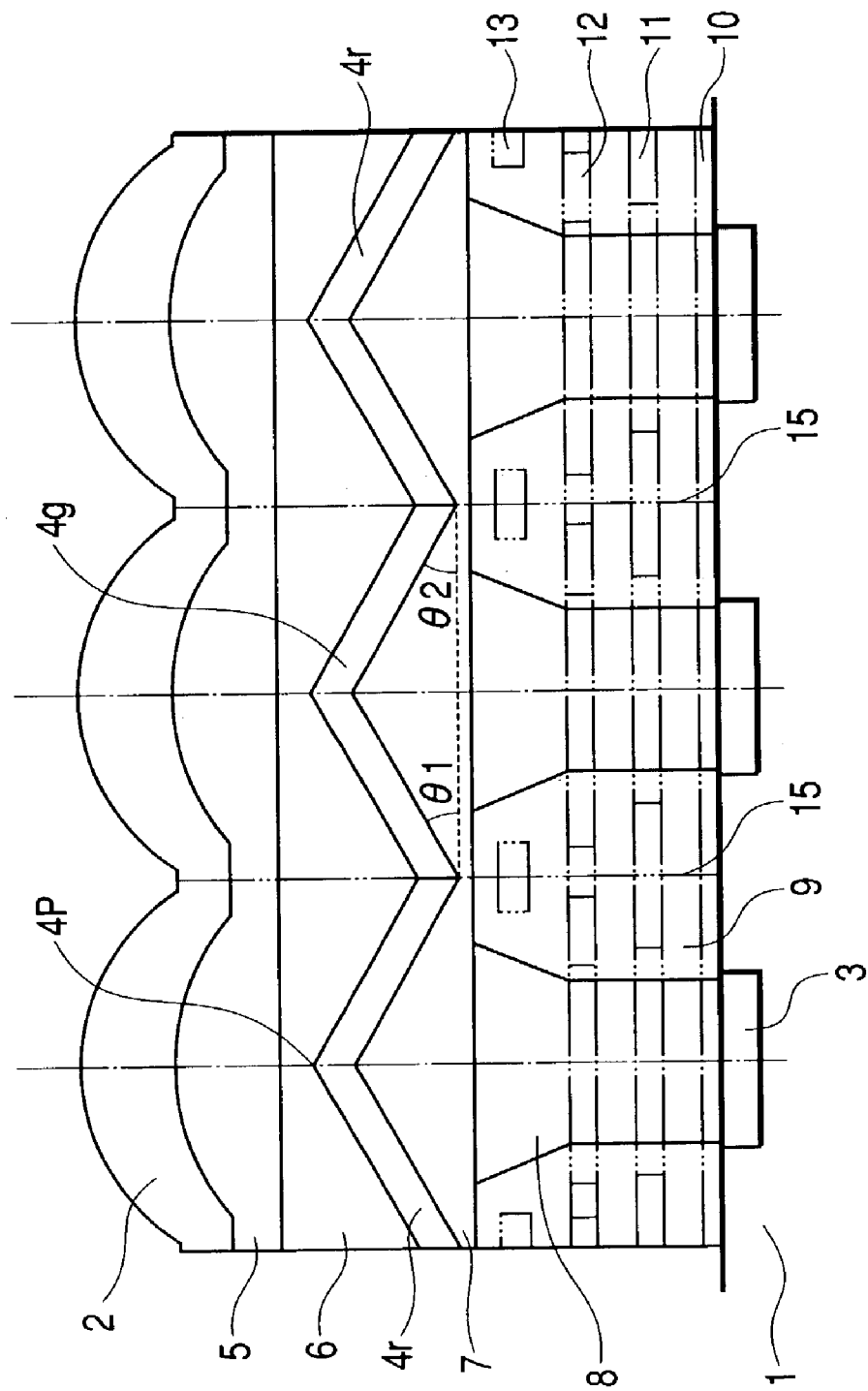
FIG. 1 is a diagram showing a first embodiment of the present invention.
Figure 2:
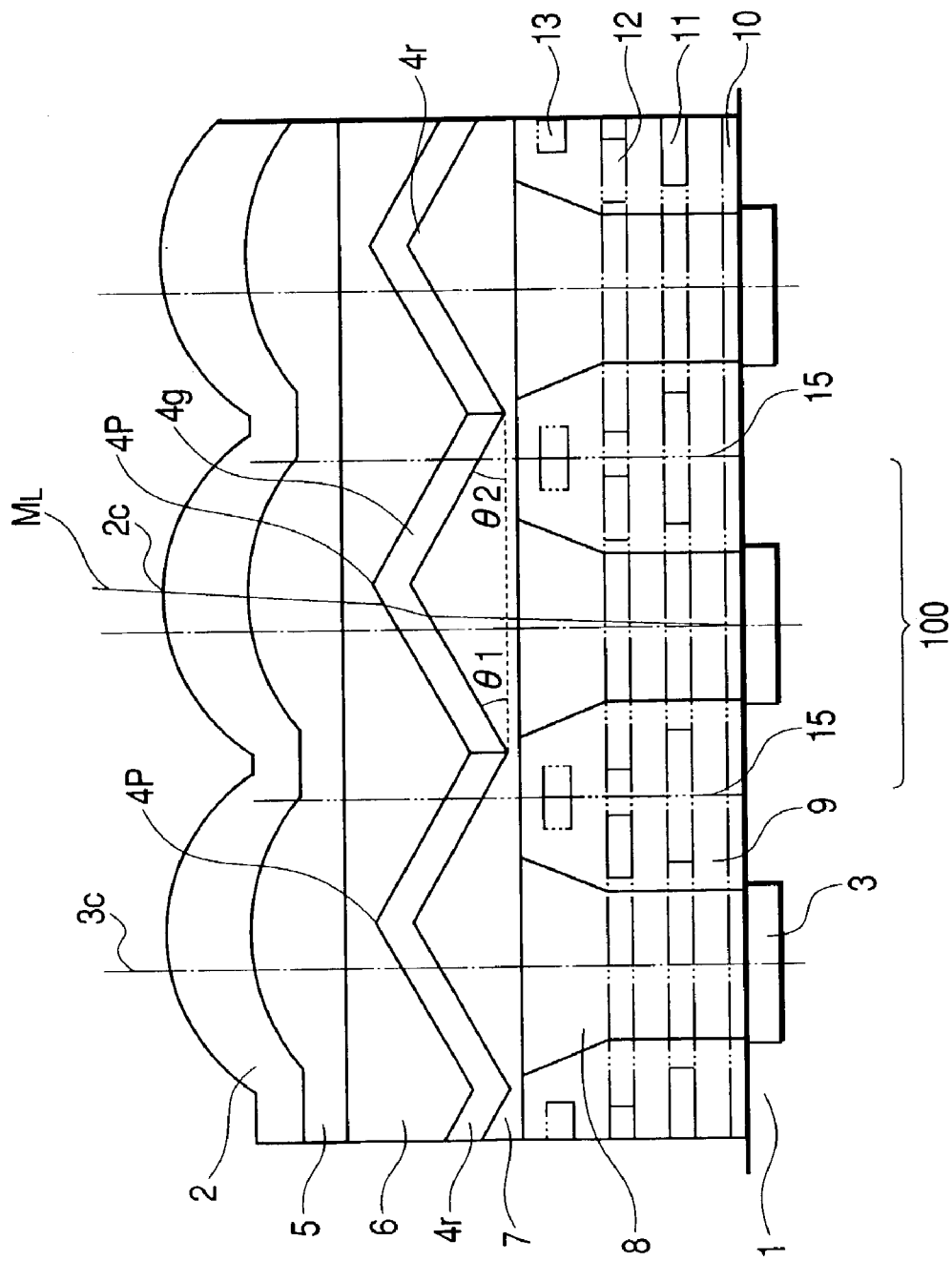
FIG. 2 is a diagram showing the first embodiment of the present invention.
Figure 3:
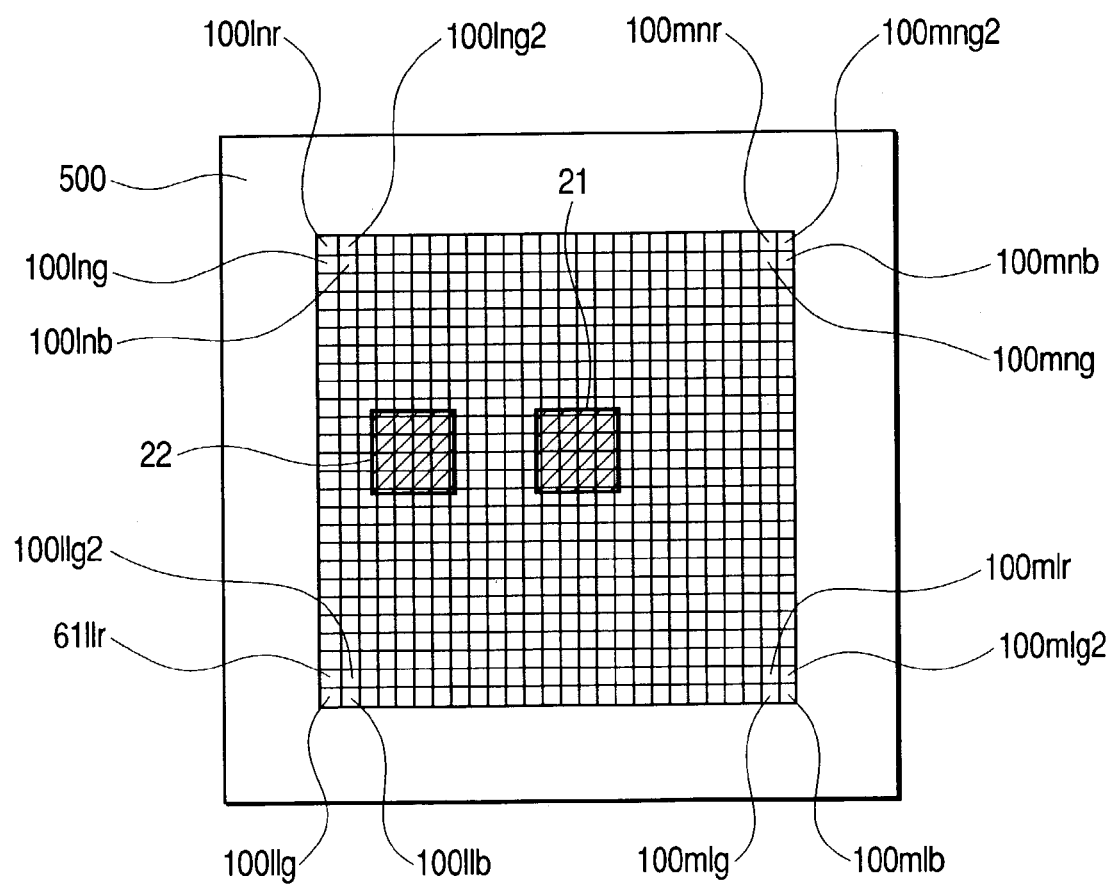
FIG. 3 is a top view of an image pickup element according to the first embodiment of the present invention.

FIG. 1 is a cross-sectional view of the center portion, i.e., a shaded portion 21 in FIG. 3, of an image pickup element wherein plurality of pixels are arranged in a direction perpendicular to a first direction. FIG. 2 is a cross-sectional view of the peripheral portion, i.e., a shaded portion 22 in FIG. 3, of the image pickup element, and FIG. 3 is a top view of the image pickup element.

In FIGS. 1 and 2, there are provided a silicon wafer 1; a micro lens 2; a photoelectric conversion section 3, for converting received photons into charges; a dichroic layer 4 (4r and 4g) which is a wavelength selection section for the wavelength separation of a light flux; a first refraction layer 5 and a second refraction layer 6; a first refraction portion 7, a second refraction portion 8 and a third refraction portion 9; and a Poly wiring layer 10 which serves as a gate for controlling the charges produced by the photoelectric conversion section 3. Wiring layers 11 to 13 are made of a metal such as aluminum, i.e., the AL1 wiring layer 1 serves as a connecting line and an output line between the individual portions, the AL2 wiring layer 12 serves as a well source line and a control line, and the AL3 wiring layer 13 serves as a light shielding layer and a power source line.

The micro lens 2 has a upward convex spherical shape and has positive lens power. Therefore, the light flux reaching the micro lens 2 is condensed and transmitted to the photoelectric conversion section 3. The first refraction index layer 5 is formed of a material having a low refraction rate, such as magnesium fluoride ($MgF_2$) which has a refraction rate of 1.38. The second refraction index layer 6, sandwiched between the first refraction index layer 5 and the dichroic layer 4 that is the wavelength selection section, is made of a material having a high refraction rate, such as titanium dioxide ($TiO_2$) which has a refraction rate of 2.5. With this configuration, as the property, the light flux that advances from the second refraction index layer 6 to the first refraction index layer 5 tends to be fully reflected by the interface.

The second refraction rate portion 8 is made of a material having a high refraction rate, such as titanium dioxide, and the third refraction rate portion 9 is made of a material having a low refraction rate, such as silicon dioxide ($SiO_2$), which has a refraction rate of 1.46, or magnesium fluoride. Therefore, since the light flux entering the second refraction rate portion 8 is easily and fully reflected at the interface with the third refraction rate portion 9, a light guide path extending to the photoelectric conversion section 3 is provided. The first refraction rate portion 7 must be formed of a material having a refraction rate the same as or lower than that of the second refraction rate portion 8, so that at the interface with the second refraction rate portion 8 full reflection is prevented. However, since it is preferable that there be only a small difference from the refraction rate of the second refraction index layer 6, silicon nitride (SiN) having a refraction rate of 2.0 can be employed.

Figure 10:
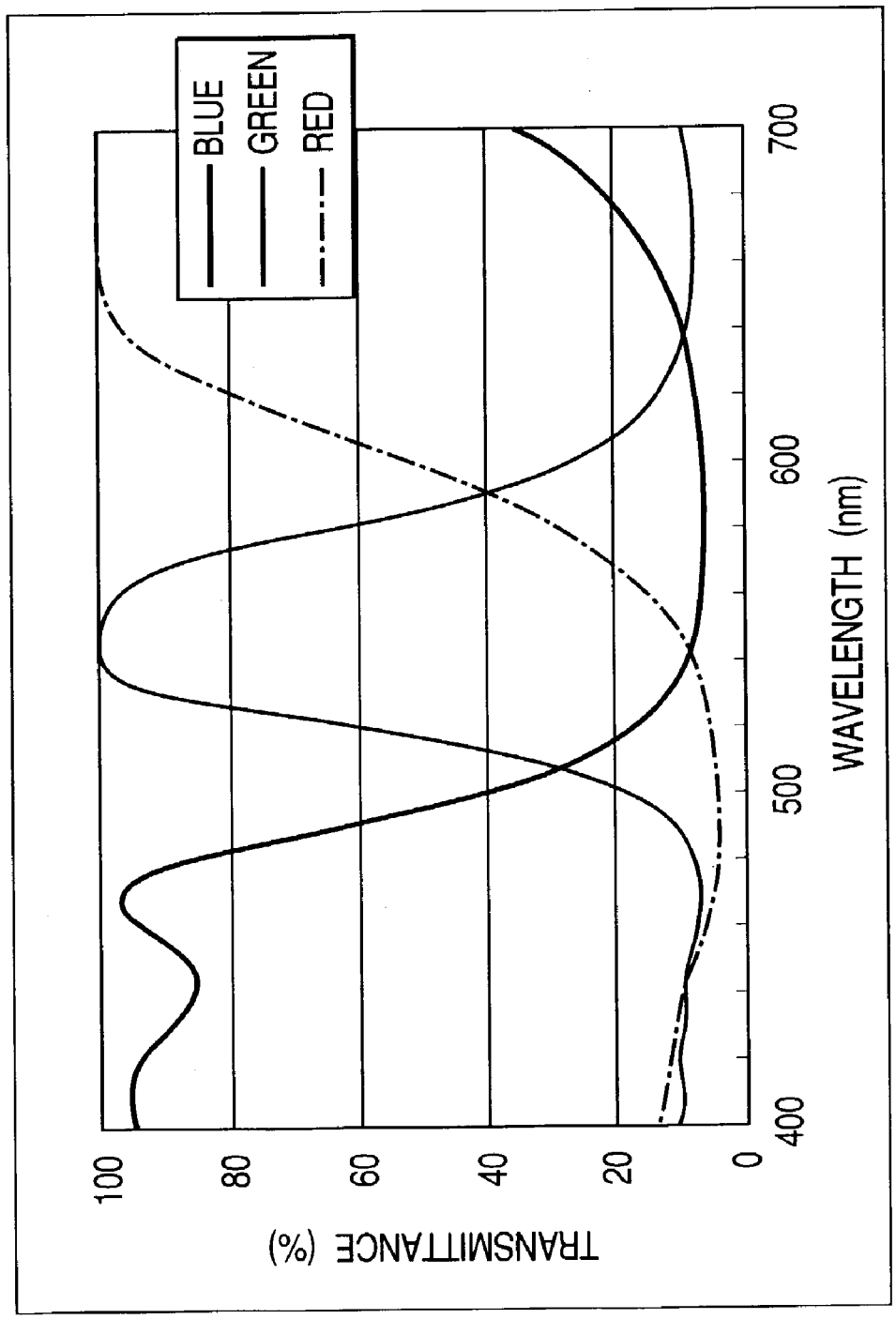
FIG. 10 is a graph showing the characteristic of a dichroic layer.

Generally, the dichroic layer is formed by alternately laminating a material having a high refraction rate and a material having a low refraction rate with a film thickness of an integer times ¼ of a target wavelength $\lambda$. With this configuration, the wavelength of a light flux to be transmitted can be selected. Thicknesses for the dichroic layer 4 used for this embodiment are shown in FIG. 9 as an example. While titanium dioxide is employed as a material having a high refraction rate and silicon dioxide is employed as a material having a low refraction rate, the layers made of these materials are provided with the number of layers and in the thicknesses thereof shown in FIG. 9. The transmittance characteristic of the dichroic layer 4 is shown in FIG. 10. And as is apparent from the characteristic graph in FIG. 10, the characteristic is close to the characteristic of a conventional color filter using color elements. Therefore, a characteristic close to that of the conventional image pickup element can be provided even by employing the dichroic layer 4 in this embodiment. The stacking of these layers can be easily performed by physical vapor deposition (PVD).

In this embodiment, assume that one pixel 100 is constituted by the silicon wafer 1, the micro lens 2, the photoelectric conversion section 3, the wavelength selection section 4, the first refraction index layer 5, the second refraction index layer 6, the first refraction rate portion 7, the second refraction rate portion 8, the third refraction rate portion 9, the Poly wiring layer 10, the AL1 wiring layer 11, the AL2 wiring layer 12 and the AL3 wiring layer 13. The pixels 100 are arranged along boundaries 15.

The pixels 100 in FIG. 2 are located at a distance from the light axis of a photographic lens (not shown). Therefore, the pupil center of the photographic lens is located to the right, and the light flux entering the micro lens 2 is angled to the right. Therefore, the micro lens 2 is arranged to the right of a center axis 3c determined by the photoelectric conversion section 3.

Furthermore, the whole quadrangular pyramid forming the dichroic layer 4 which is the wavelength selection section, is shifted to the right. That is, the dichroic layer 4 which is the wavelength selection section, is positioned so that vertex 4P is located on the right side, while the quadrangular pyramids have the same shape, i.e., the angle θ1 of the left slope of the quadrangular pyramid is the same as the angle θ2 of the right slope (θ1=θ2). More specifically, in the configuration for this embodiment, the vertex 4P of the dichroic layer 4 which is the wavelength selection section, is located on the right side of the main light $M_L$ passing through a vertex 2c of the micro lens 2.

When, contrary to FIG. 2, the pupil center of the photographic lens is located on the left side, the dichroic layer 4 which is the wavelength selection section, is positioned so that the vertex 4P is located on the left side of the main light $M_L$ passing through the vertex 2c of the micro lens 2.

Figure 4:
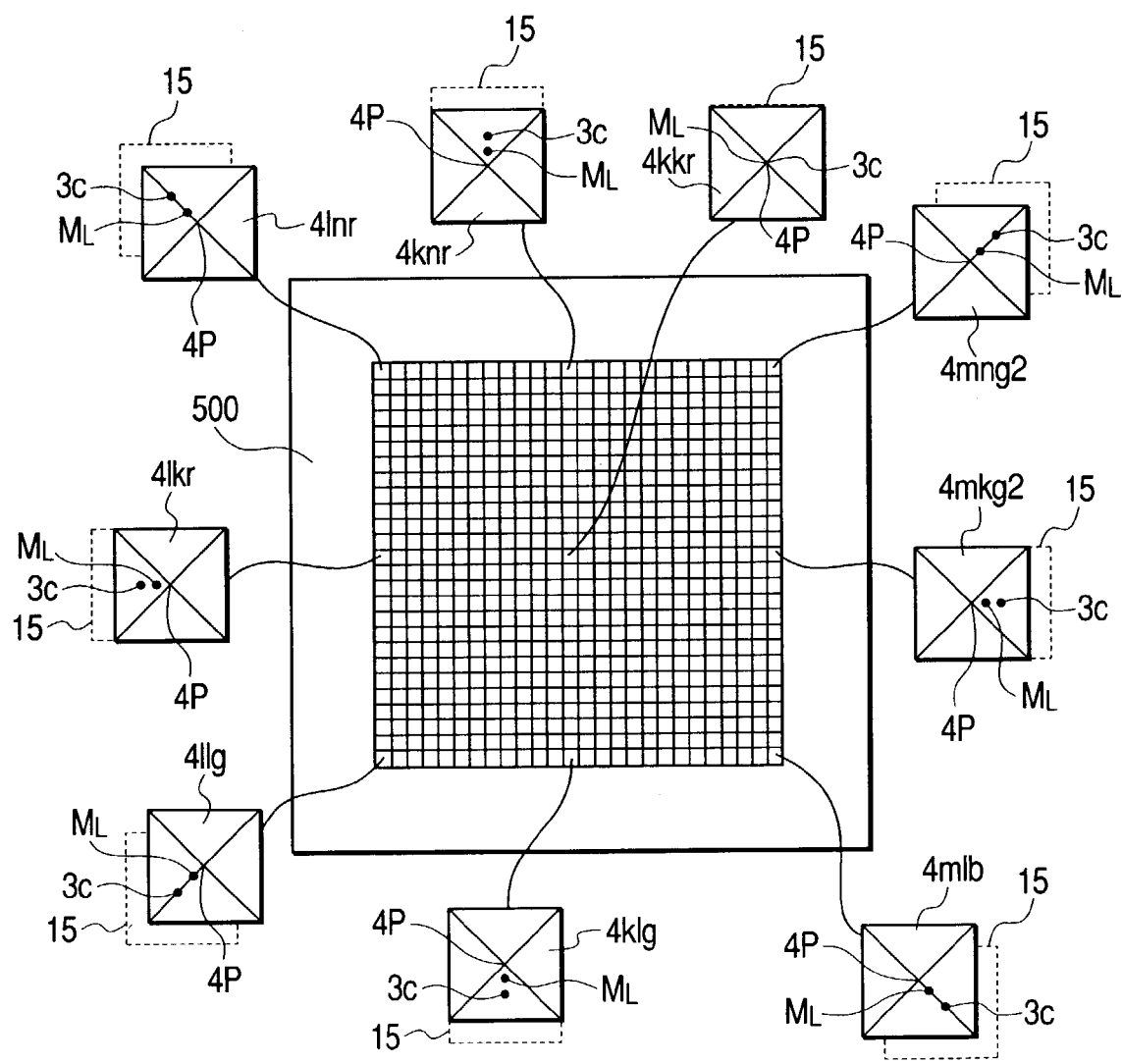
FIG. 4 is a diagram for explaining a wavelength selection section provided for the image pickup element according to the first embodiment of the present invention.

FIG. 4 is an enlarged diagram for explaining the dichroic layer 4 that is the wavelength selection section provided for the image pickup element. The wavelength selection section 4 is located at individual sections around the periphery of the image pickup element. In the peripheral portion of the image pickup element, without changing the shape of the dichroic layer 4 that serves as the wavelength selection section, the dichroic layer 4 is arranged so that the vertexes 4P are located closer to the center of the image pickup element than the center axis 3c determined by the photoelectric conversion section 3. That is, θ1=θ2, and the boundary 5 of the pixels 100 is shifted away from the bottom face of the dichroic layer 4, which is the wavelength selection section. To explain in more detail, the dichroic layer 4 that serves as the wavelength selection section is positioned so that each of the vertexes 4P thereof is located closer to the center of an image pickup element 500 than the main light $M_L$ passing through the vertex 2c of the micro lens 2.

An explanation will now be given for the movement of a light flux that entered at a view angle relative to the peripheral portion of the image pickup element according to the first embodiment.

Figure 5:
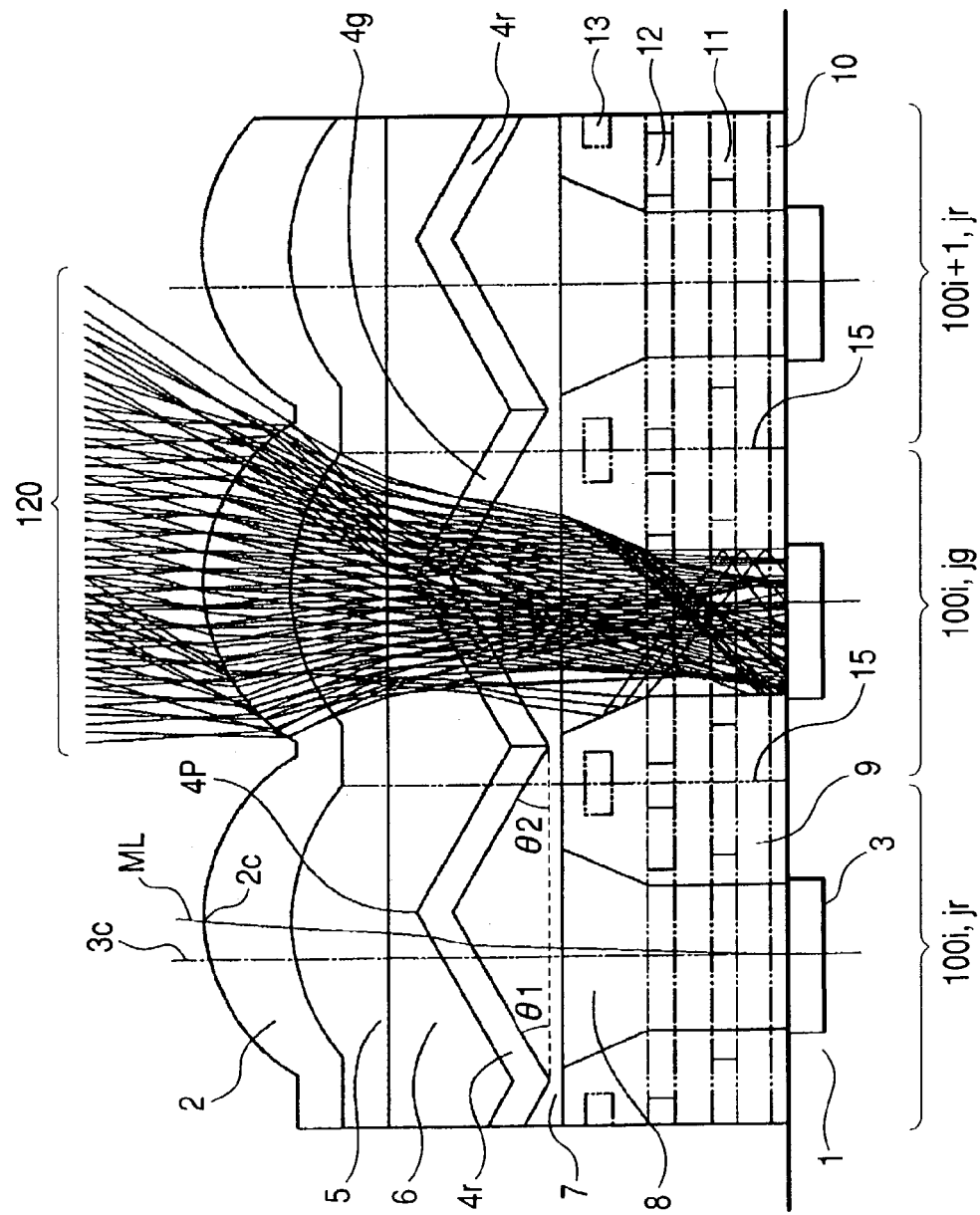
FIG. 5 is a light tracing diagram (for transmitted light) according to the first embodiment of the present invention.

FIG. 5 is a diagram showing the movement of a light flux that passes through the dichroic layer 4 that is the wavelength selection section. The light flux, which entered from above in FIG. 5, is transmitted to the micro lens 2 and is condensed. Then, the light is transmitted to the first refraction index layer 5 and the second refraction index layer 6, in this order, and reaches the dichroic layer 4g. The dichroic layer 4, which is the wavelength selection section, selectively passes only a light flux having a predetermined wavelength and transmits it to the first refraction rate portion 7. The light advances to the second refraction rate portion 8, and is repetitively, fully reflected by the interface between the second refraction rate portion 8 and the third refraction rate portion 9. Through this process, the light is guided to the photoelectric conversion section 3. Since the interface between the second refraction rate portion 8 and the third refraction rate portion 9 is tapered, with the incident portion being spread, the light can also be fully reflected at the tapered face, and can be guided to the photoelectric conversion section 3.

Almost the same movement of the light flux is obtained for adjacent pixels $100_{i,j}r$ and $100_{i+1,j}r$.

Figure 6:
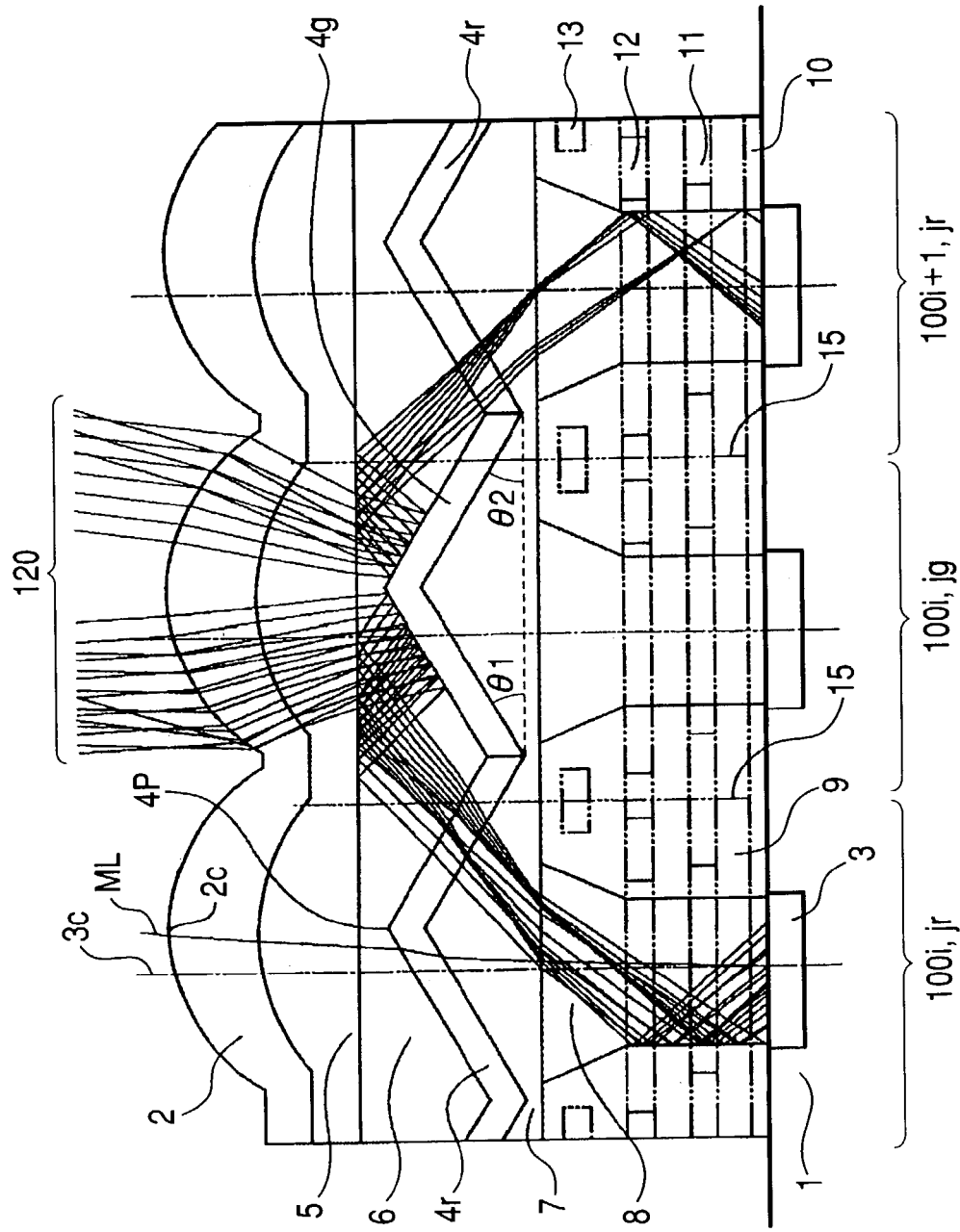
FIG. 6 is a light tracing diagram (for reflected light) according to the first embodiment of the present invention.

FIG. 6 is a diagram showing the movement of a light flux that enters a pixel $100_{i,j}g$, which receives green light, and is reflected by the dichroic layer 4g, i.e., the movement only of a light flux that includes blue light and red light. The light flux output from the pupil of the photographic lens, which is located at an appropriate distance in accordance with the pixel size, is passed through an infrared cut filter and is changed to an object light flux 120. The object light flux 120, which entered from above in FIG. 6, is transmitted to the micro lens 2 and is condensed. The resultant light 120 is then enters the first refraction index layer 5 and the second refraction index layer 6 in this order, and reaches the dichromic film 4g. At this time, the light flux other than green light is reflected in accordance with the characteristic of the dichroic layer 4 that is deposited on the faces forming the quadrangular pyramid. Since the deposited dichroic layer 4 is formed in a quadrangular pyramid shape, the reflected light flux is advanced while the direction is changed outward from the center. Further, from among the light reflected on the dichroic layer 4, the light flux having a critical angle or more is fully reflected by the interface between the second refraction index layer 6 and the first refraction index layer 5. The light flux, which is again directed downward, advances to the adjacent pixels $100_{i,j}r$ and $100_{i+1,j}r$ that receive red light. The light flux passing through the dichroic layer 4r is transmitted to the first refraction rate portion 7 and the second refraction rate portion 8, in this order. Following this, the light is transmitted from the second refraction rate portion 8 to the third refraction rate portion 9, and at this time, since as is described above the second refraction rate portion 8 has a higher refraction rate than the third refraction rate portion 9, the light flux having the critical angle or more is fully reflected at the interface. Since the interface between the second refraction rate portion 8 and the third refraction rate portion 9 is tapered, with the light incident portion being spread, the area size for introducing the incident light flux is extended, so that a large amount of light flux can be obtained at the second refraction rate portion 8. Further, since the interface near the photoelectric conversion section 3 is formed of two faces, substantially parallel to the perpendicular direction, the light flux that is fully reflected the first time and does not enter the photoelectric conversion section is fully reflected again at the opposite interface. Thus, finally, all of the light flux enters the photoelectric conversion section 3.

In this configuration, the dichroic layer 4 that is the wavelength selection section is positioned so that the vertexes 4P are located closer to the center of the image pickup element 500 than the main light $M_L$ passing through the vertex 2c of the micro lens 2. Therefore, since the light flux reflected by the dichroic layer 4, which is the wavelength selection section, uniformly enters the photoelectric conversion section 3 of an adjacent pixel, appropriate optical low-pass effects can be obtained.

As is described above, in the center portion of the image pickup element, the center of the micro lens 2, the vertexes of the dichroic layer 4 and the center of the photoelectric conversion section 3 match in the direction perpendicular to the plane of the image pickup element. Further, in the peripheral portion of the image pickup element, the vertexes 4P of the dichroic layer 4 are positioned closer to the center of the image pickup element than the center of the photoelectric conversion section 3.

Therefore, according to the image pickup element of this embodiment, effective light reception is implemented.

In this embodiment, in the peripheral portion of the image pickup element, the vertex 4P of the dichroic layer 4g, which is the wavelength selection section, has been located on the right side of the main light $M_L$ passing through the vertex 2c of the micro lens 2. However, as is shown in FIG. 7, the main light $M_L$ may pass through the vertex 2c of the micro lens 2 and the vertex 4P of the wavelength selection section.

Figure 7:
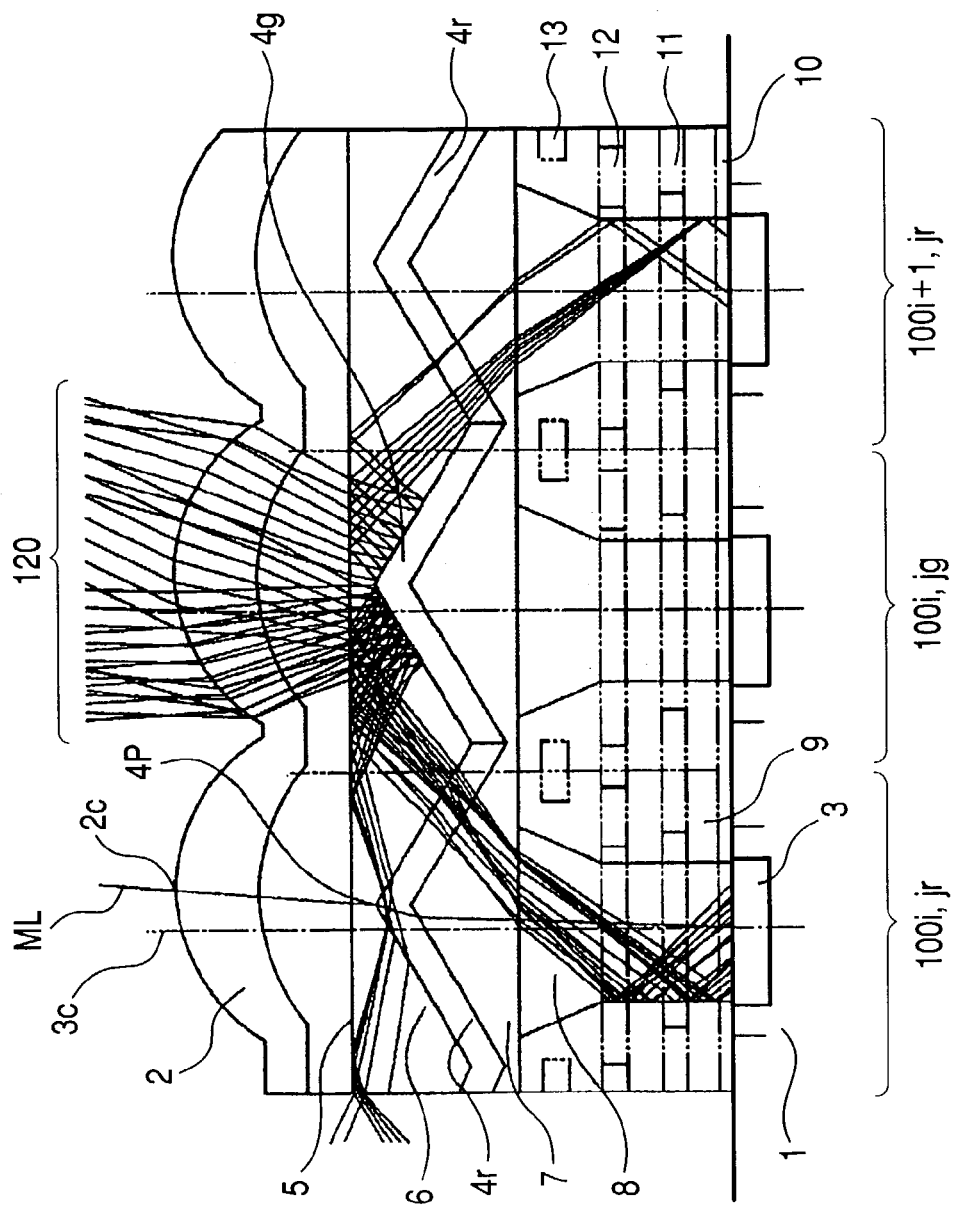
FIG. 7 is a light tracing diagram (for reflected light) according to the first embodiment of the present invention.
Figure 8:
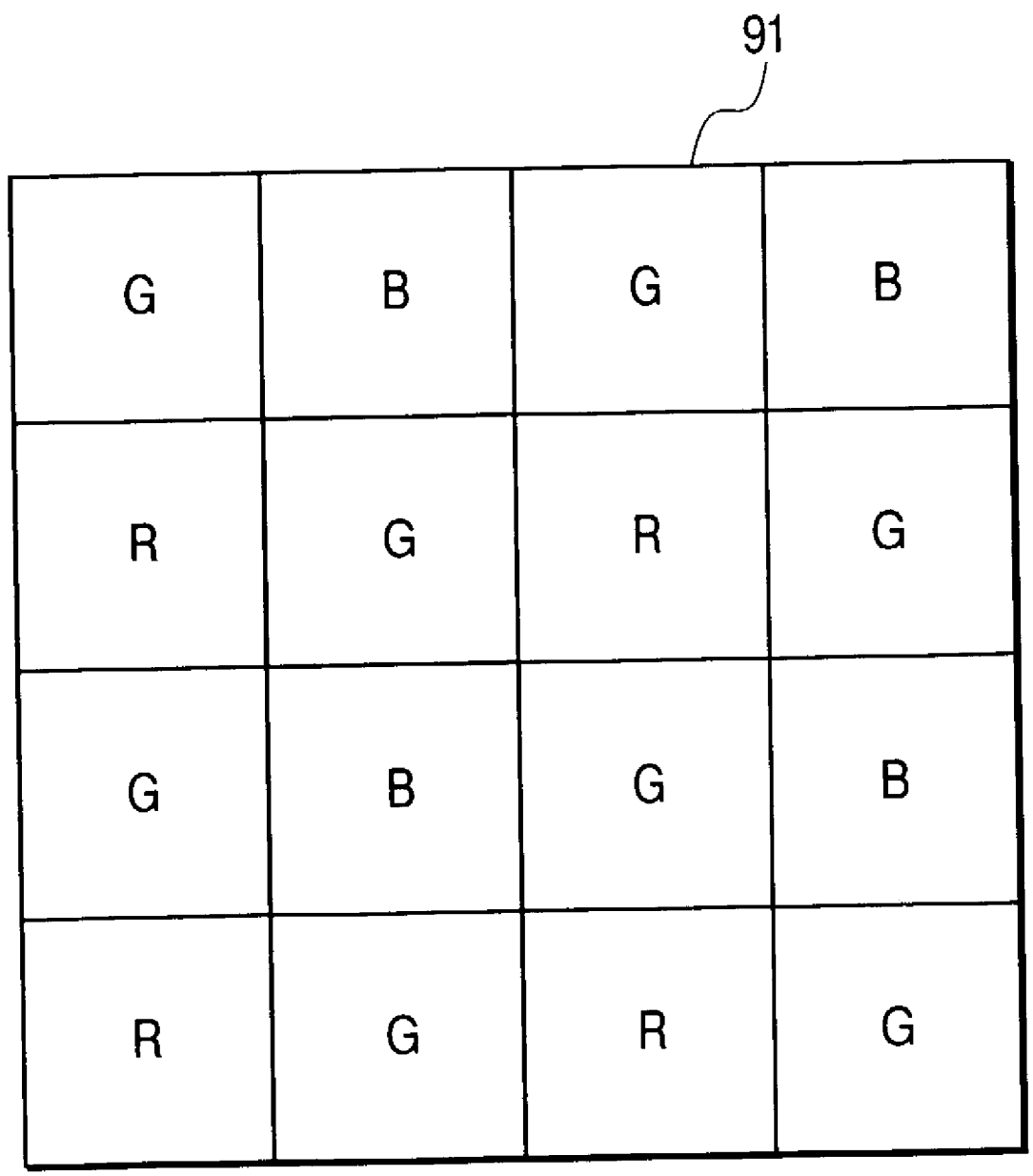
FIG. 8 is a diagram showing the structure of a pixel.

According to the configuration in FIG. 7, compared with the configuration in FIG. 2, between the pixel $100_{i,j}r$ and the pixel $100_{i+1,j}$ the amount of light that is reflected by the wavelength selection section 4g and enters the adjacent pixel differs, and the balance of the remaining light quantity is slightly deteriorated. However, compared with the case wherein the total area of the image pickup element is used as the structure of the pixel in FIG. 1, the light is efficiently received, even at the peripheral portion.

An explanation will now be given for the efficiency with which a light flux is introduced using the light transmission and reflection provided by the dichroic layer. For example, for a CCD image pickup element wherein pixels including primary color filters providing superior color reproduction are arranged in a mosaic shape, R (red), G (green) and B (blue) optical filters are positioned, with one filter for each color, between the micro lens 2 and the photoelectric conversion section 3.

At this time, at a pixel for which the red optical filter is provided, only red light is photoelectrically converted, and blue light and green light are absorbed by the optical filter and only produce heat. Similarly, at a pixel for which the green optical filter is provided, blue right and red light are not photoelectrically converted and only produce heat, and at a pixel for which the blue optical filer is provided, green light and red light are not photoelectrically converted and only produce heat. That is, at the pixels of the conventional color image pickup element, of the incident light fluxes, only light that passes through a predetermined optical filter is photoelectrically converted into an electric signal to be output, and light that can not pass through the predetermined optical filter only produces heat and is discarded.

Figure 28:
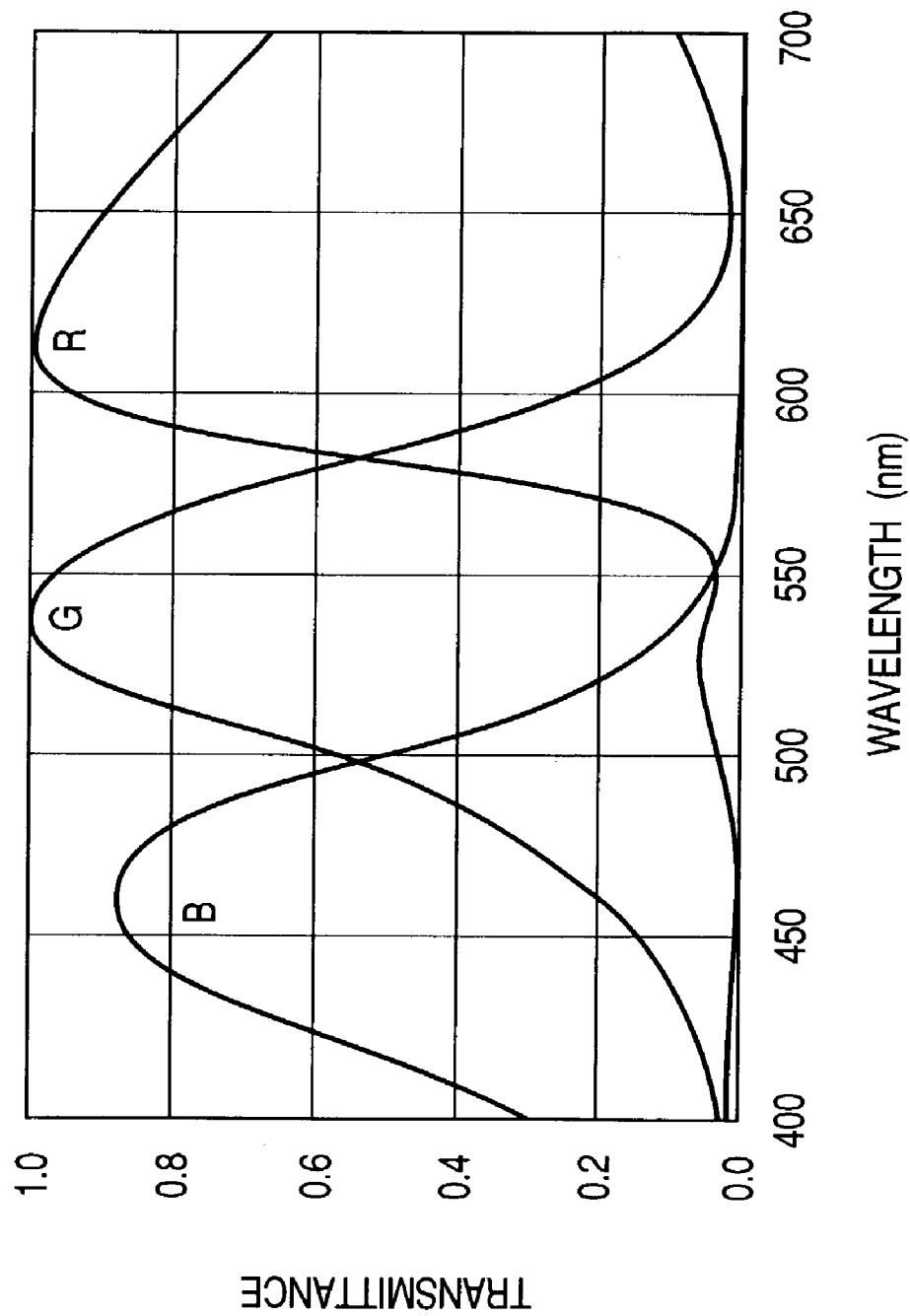
FIG. 28 is a graph showing the characteristic of a conventional color filter.

FIG. 28 is a diagram showing the characteristic of a spectral transmittance characteristic of the RGB color filter in the image pickup element. Since the linfrared ray transmittance is high, actually, an infrared cut filter for blocking a wavelength of 650 nm or higher is additionally located between the image pickup element and a photographic lens. As is apparent from this characteristic, in a pixel, only about ⅓ of the visible light is effectively employed.

The usage efficiency for the individual RGB colors will be described in more detail. For example, the dimension ratio of the RGB pixels of a color image pickup element having a Bayer array is ¼:2/4:¼, when the dimension of a unit that constitutes a regular array is defined as 1. In this case, the rate of green light used when the total light quantity is defined as 1 is a product of the term for the wavelength selection and the term of the dimension ratio, i.e., ⅓×2/4=⅙. Similarly, the usage rate for each of the red and blue lights is ⅓×¼=1/12. The total usage rate is ⅙+1/12+1/12=⅓, and the usage efficiency of the light is still ⅓. On the contrary, when the total light quantity is defined as 1, ⅔×2/4=⅓ of green light and ⅔×¼=⅙ of red light and blue light are not effectively employed.

The image pickup element using the primary color filters have been described. However, in an image pickup element using complementary color filters, about ⅓ of the visual radiation is not photoelectrically converted, and is not effectively employed. As is described above, for the conventional one-chip image pickup element using either the primary color filters or the complementary color filters, light usage efficiency is low because the image pickup plane is divided by the color filters.

Figure 11:
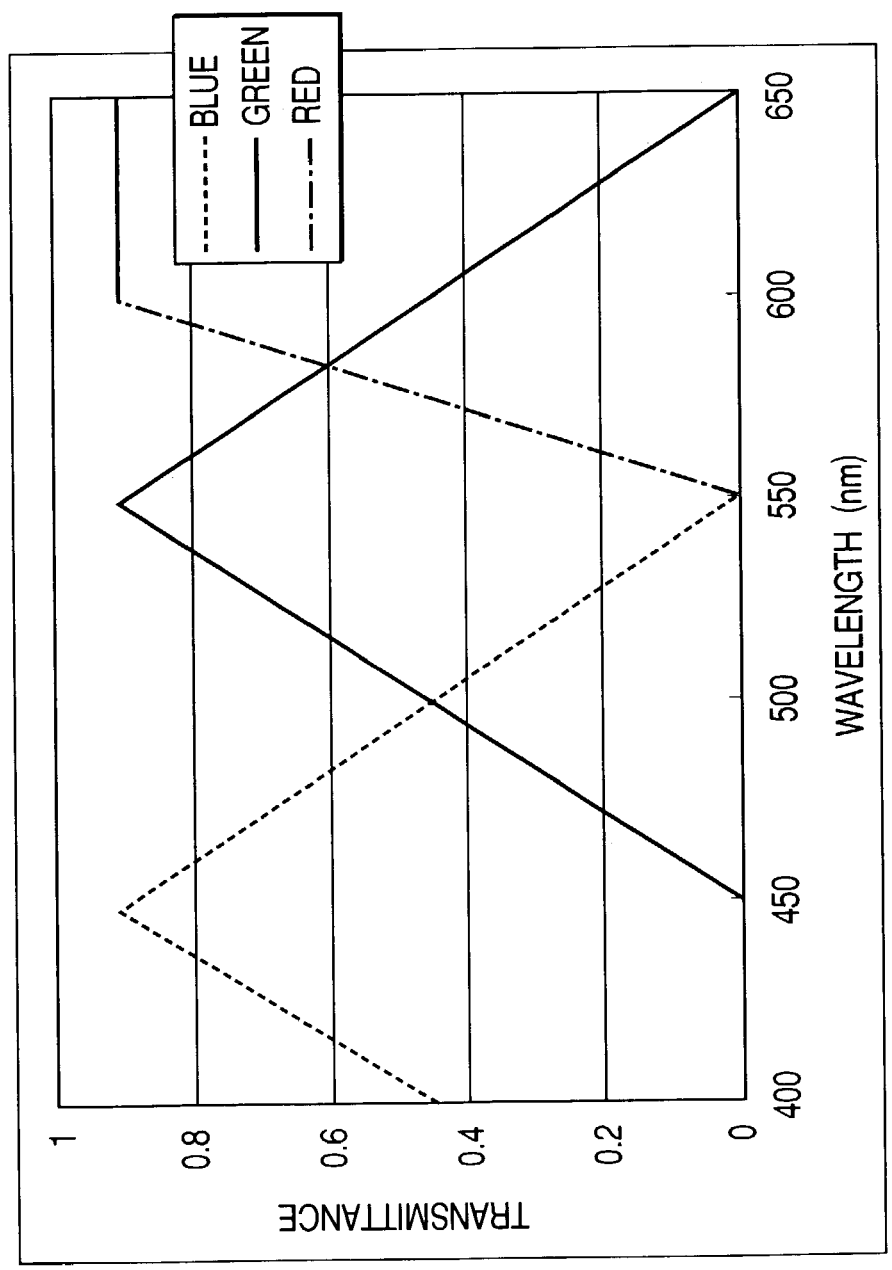
FIG. 11 is a schematic graph showing the characteristic of a dichroic layer.

FIG. 11 is a graph showing simplified transmittance characteristics of the dichroic layer for the individual colors. In FIG. 11, the reverse curve of the transmittance curve for each color represents the reflection characteristic. Further, to simplify the calculation, it is assumed that all the light flux that does not pass through the dichroic layer is reflected, and that all the reflected light flux equally reaches the adjacent pixels. Further, it is also assumed that the pixels array is the Bayer array shown in FIG. 8.

Figure 12:
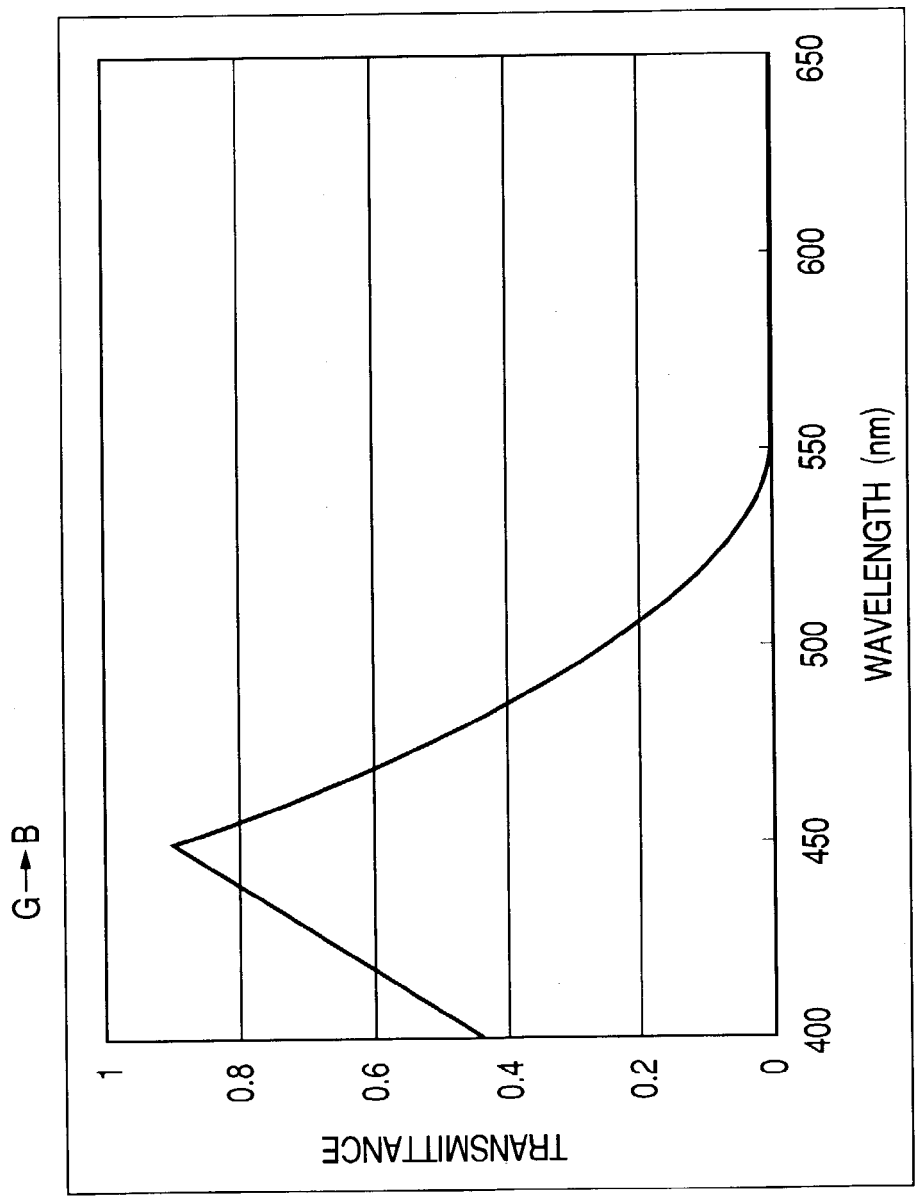
FIG. 12 is a schematic graph showing the simplified characteristic of light reflected by a G transmission dichroic layer and passed through a B transmission dichroic layer.
Figure 13:
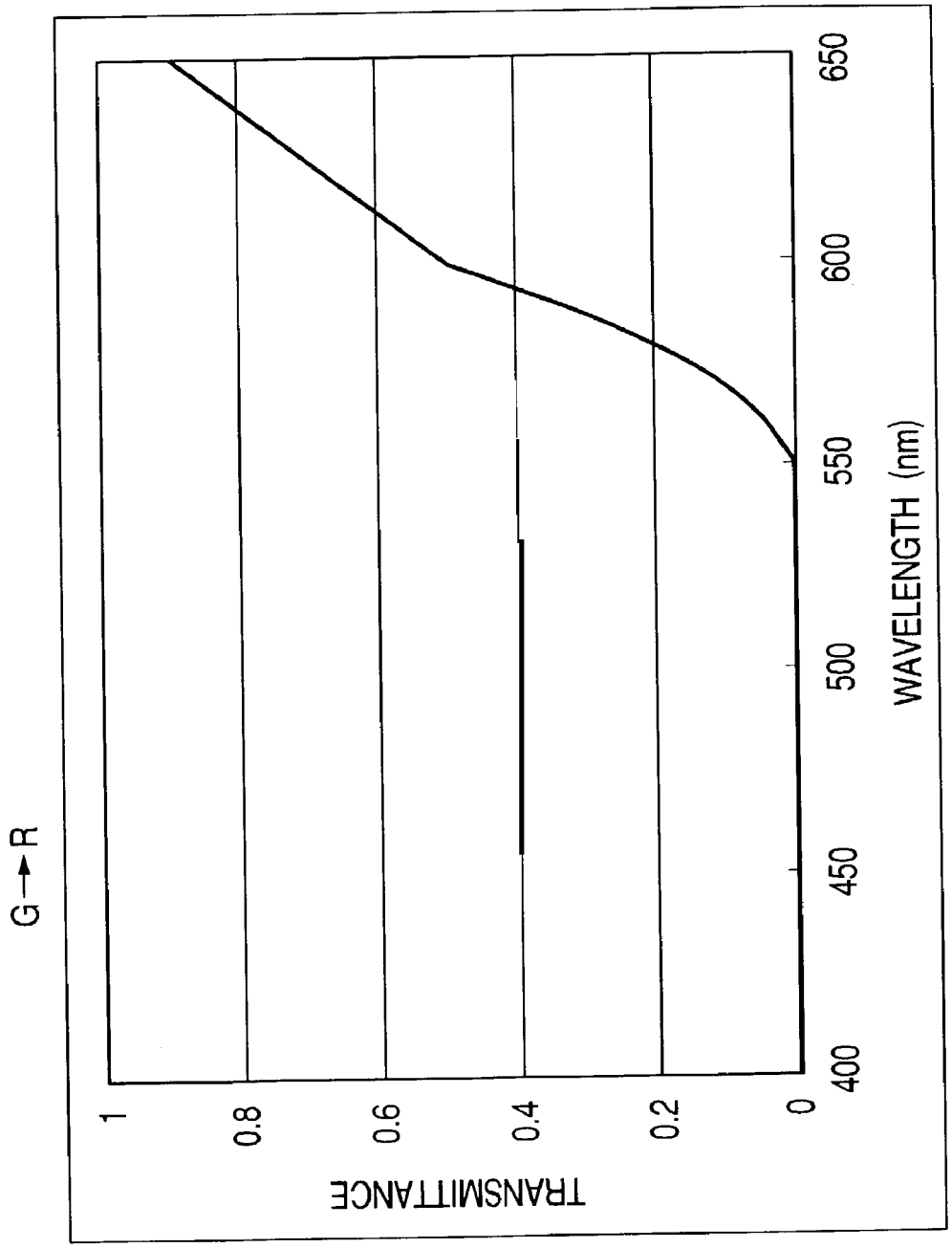
FIG. 13 is a schematic graph showing the characteristic of light reflected by a G transmission dichroic layer and passed through an R transmission dichroic layer.
Figure 14:
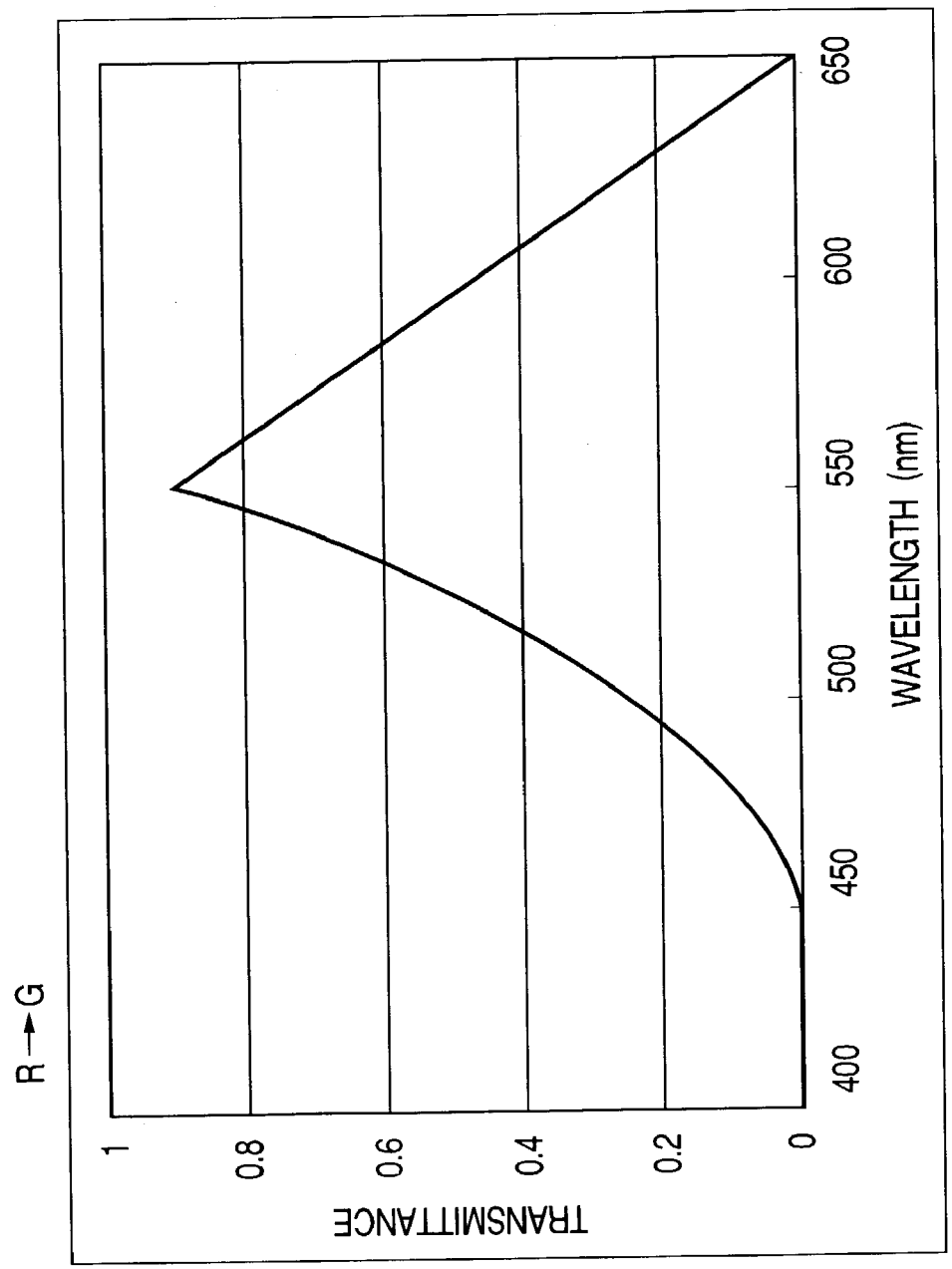
FIG. 14 is a schematic graph showing the characteristic of light reflected by an R transmission dichroic layer and passed through a G transmission dichroic layer.
Figure 15:
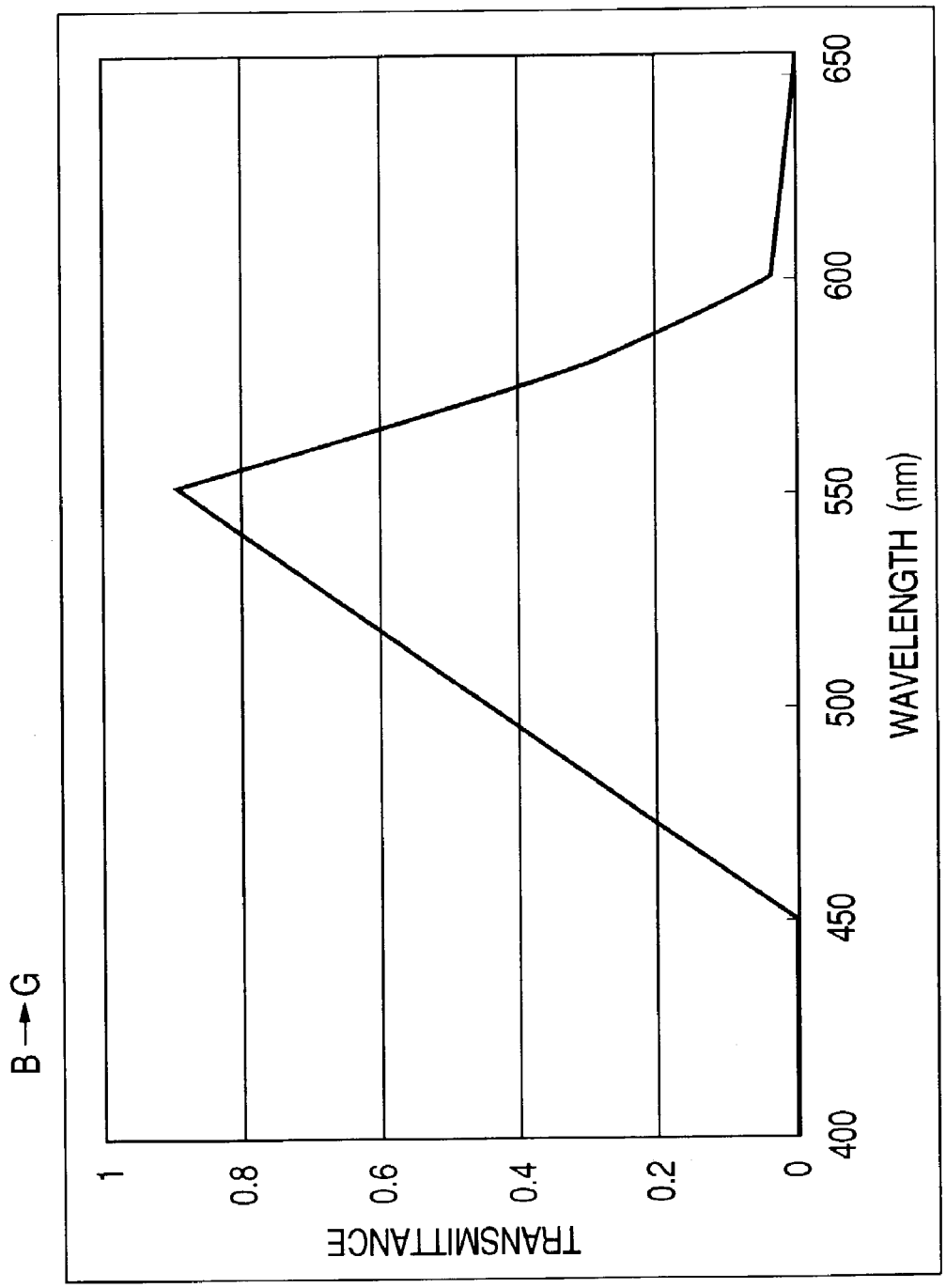
FIG. 15 is a schematic graph showing the characteristic of light reflected by a B transmission dichroic layer and passed through a G transmission dichroic layer.

Assume a case exists wherein the light flux is reflected to the dichroic layer from a pixel that receives green light and is transmitted through the dichroic layer to a pixel of blue and is captured by the photoelectric conversion section of blue. In this case, as is described above, since the inversion of the green transmittance characteristic represents the reflection characteristic, a product of this characteristic and the blue transmittance characteristic is the reflection characteristic, which is shown in FIG. 12. Similarly, for the other colors, the reflection characteristic for light transmitted from the green pixel to the red pixel is shown in FIG. 13, the reflection characteristic for light transmitted from the red pixel to the green pixel is shown in FIG. 14, and the reflection characteristic for light transmitted from the blue pixel to the green pixel is shown in FIG. 15.

An explanation will now be given for reflected light that enters the green pixel from an adjacent pixel. Since the pixel array is the Bayer array, the adjacent pixels are two red pixels and two blue pixels. Thus, the light flux that the green pixel receives from the adjacent pixels is (blue reflected light)×¼×2+(red reflected light)×¼×2). Originally the amount of the light flux received by the green pixel is the integral value of the transmittance curve for the blue pixel, and when this amount of light flux is defined as 1, the amount of light reflected by the red pixel is 0.74, and the amount of light reflected by the blue pixel is 0.85. Since the total amount of reflected light is 0.80, it is found that this is 1.80 times the amount when only the light flux passing through the dichroic layer is captured.

For the blue pixel, there are four adjacent green pixels. When the integral value of the transmittance curve for the blue pixel is defined as 1, the integral value in FIG. 12 is 0.84. Since the amount of light flux received from the adjacent pixels is (green reflected light)×¼×4, the total amount of light is 0.84, which is 1.84 times the original amount of transmitted light.

Finally, for the red pixel, as well as for the blue pixel, there are four green adjacent pixels. When the integral value of the transmittance curve for the red pixel is defined as 1, the integral value in FIG. 13 is 0.67. Since the amount of light flux received from the adjacent pixels is (green reflected light)×¼×4, the total amount of light is 0.67, which is 1.67 times the original amount of transmitted light.

As is described above, since the pixels adjacent to each other are not the same color, as in the Bayer array, the structure in this embodiment need only be employed for all the pixels to split or reflect unnecessary wavelength components to adjacent pixels. Thus, in the adjacent pixels, these wavelength components can be photoelectrically converted as effective components, and the light usage efficiency can be considerably improved.

Further in this embodiment, as is shown in FIG. 1, the dichroic layer 4, which is the wavelength selection section, is arranged so that, without changing the shape of the dichroic layer 4, the vertexes 4P of the dichroic layer 4 are positioned closer to the center of the image pickup element 500 than the main light $M_L$ passing through the vertex 2c of the micro lens 2. Therefore, since a ray reflected by the dichroic layer 4, which is the wavelength selection section, can be employed to adjust the balance of the light quantities that reenter the photoelectric conversion sections of adjacent pixels, appropriate optical low-pass effects can be obtained.

In this embodiment, the angle between the first direction and the second direction for arranging the pixels 100 is a right angle. However, the pixels 100 may be arranged to form a honeycomb-like structure, i.e., an angle between the first direction and the second direction may be 60 degrees, or another angle may be employed. Furthermore, the pixels 100 may be arranged one-dimensionally.

While in this embodiment the dichroic layer 4, which is the wavelength selection section, is shaped like a quadrangular pyramid, another polygonal pyramid, such as a hexagonal pyramid or an octagonal pyramid, may be employed.

Second Embodiment

A second embodiment of the present invention is shown in FIGS. 16 to 19.

Figure 16:
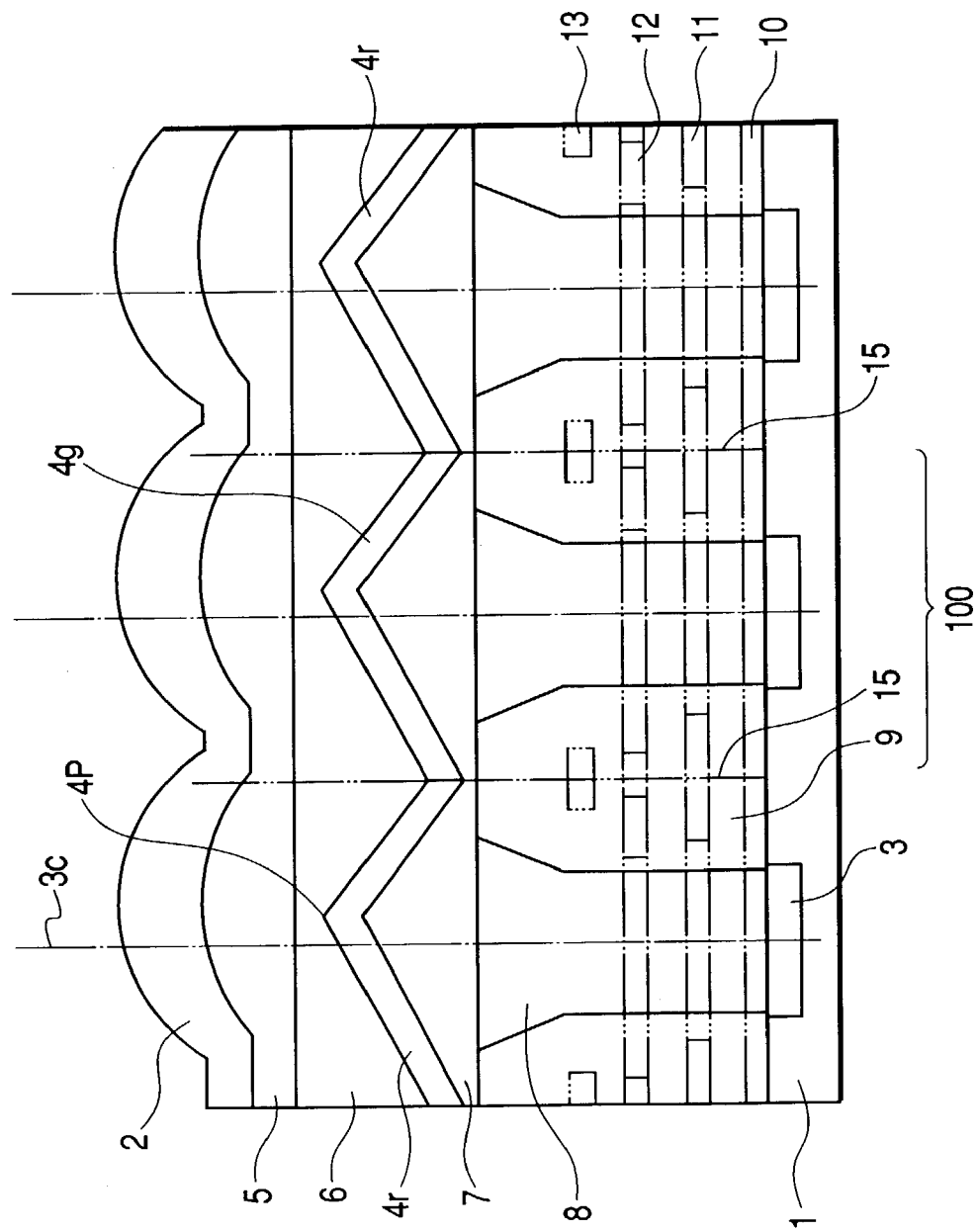
FIG. 16 is a diagram according to a second embodiment of the present invention.
Figure 17:
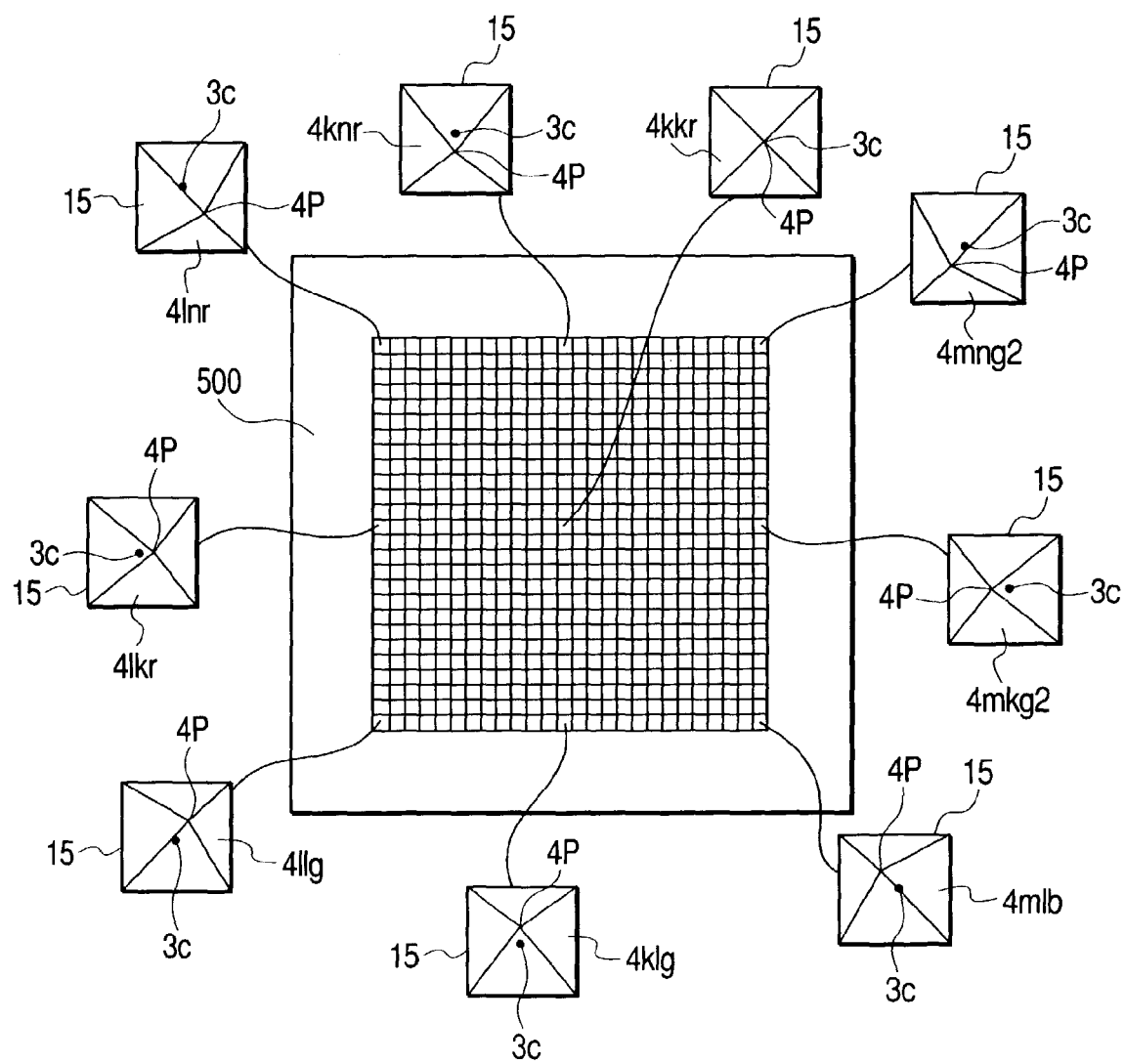
FIG. 17 is a diagram for explaining a wavelength selection section provided for an image pickup element according to the second embodiment of the present invention.
Figure 18:
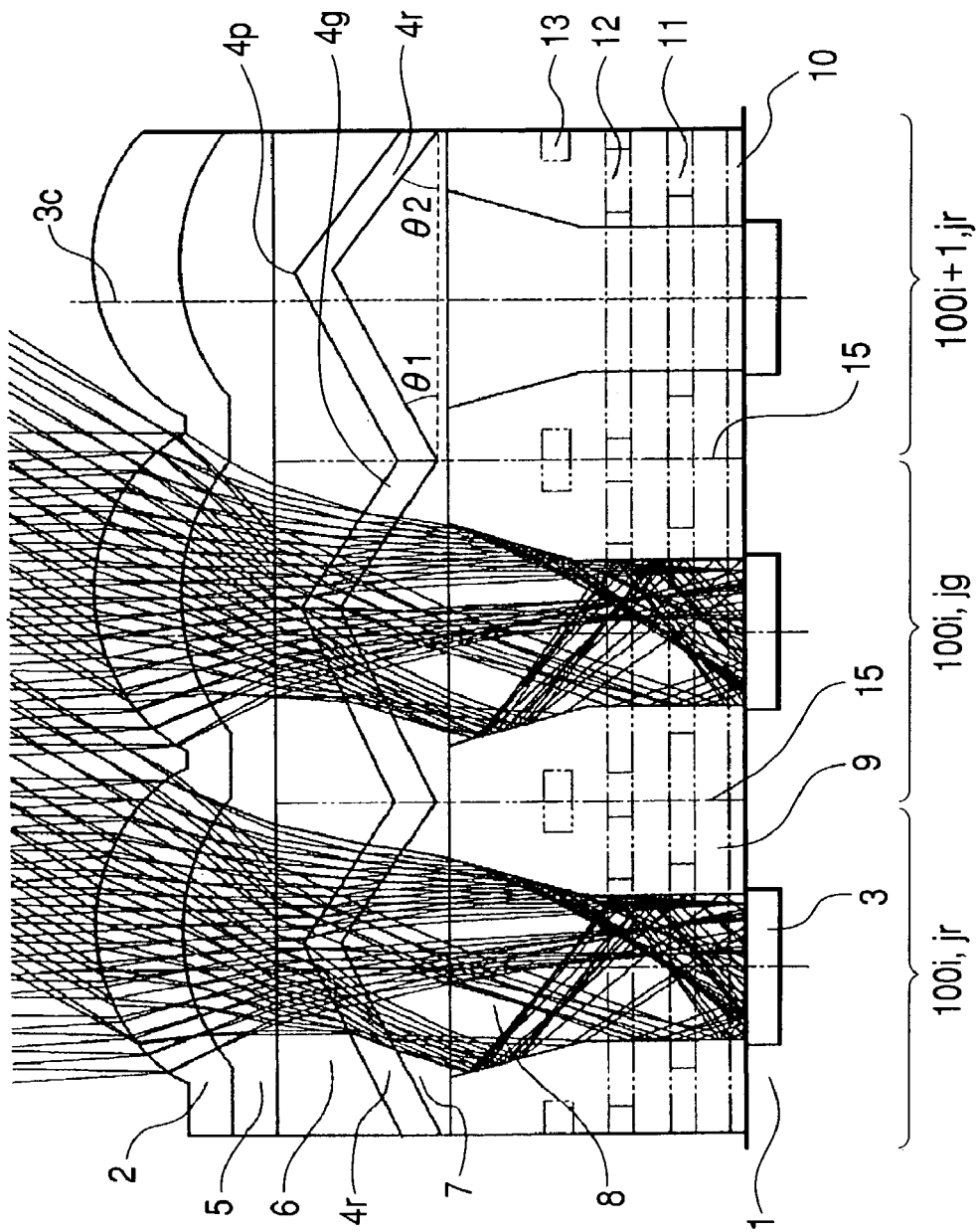
FIG. 18 is a light tracing diagram (for transmitted light) according to the second embodiment of the present invention.
Figure 19:
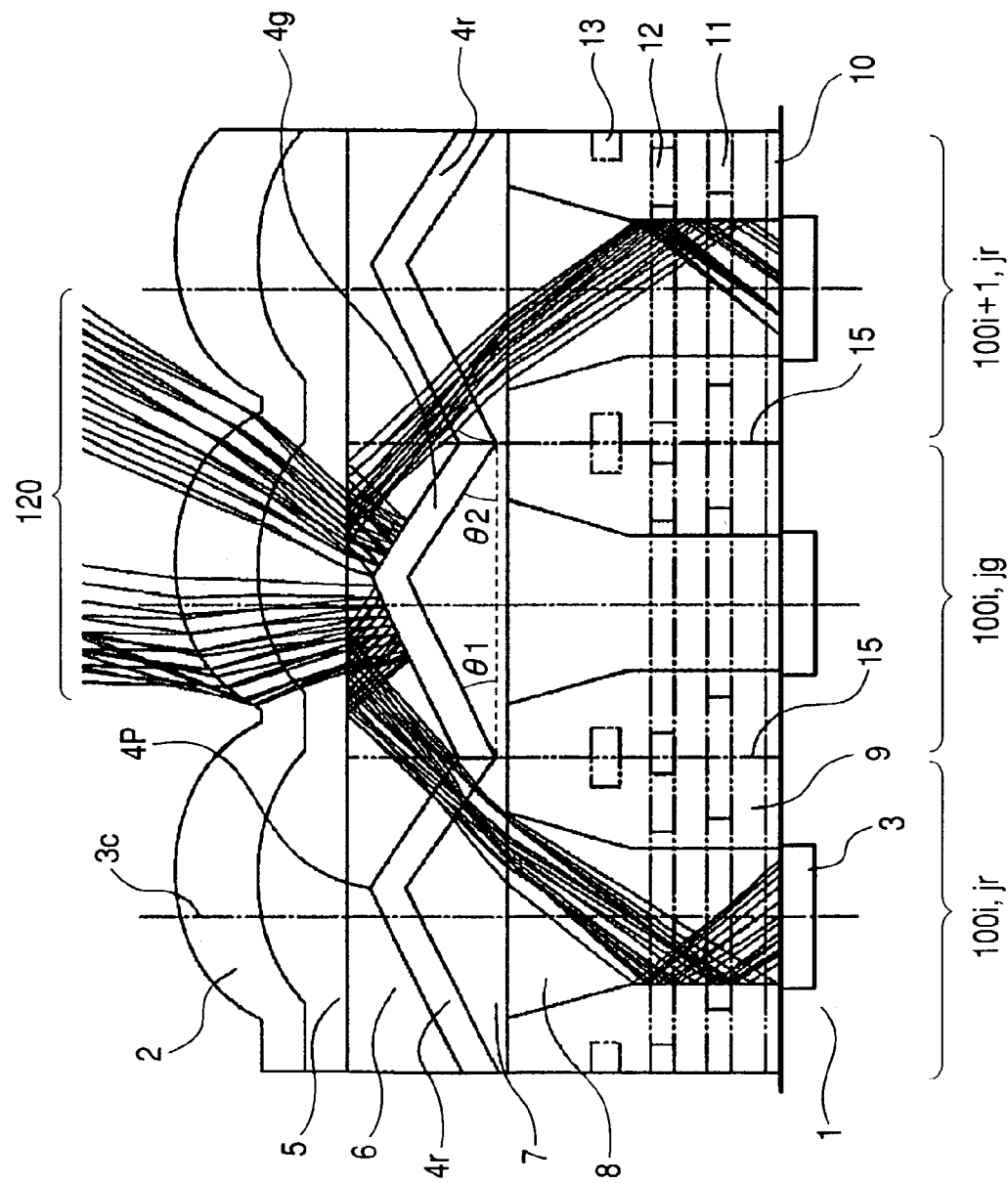
FIG. 19 is a light tracing diagram (for reflected light) according to the second embodiment of the present invention.

The components denoted by the same reference numerals as are used in the first embodiment have the same functions as corresponding components in the first embodiment. FIG. 16 is a cross-sectional view of an image pickup element according to the second embodiment, FIG. 17 is a diagram for explaining a wavelength selection section 4 arranged in the image pickup element. FIGS. 18 and 19 are diagrams showing the movement of a light flux in the image pickup element of this embodiment.

In the structure in FIG. 16, pixels in the peripheral portion of the image pickup element, i.e., pixels arranged near a dichromic film 4lkr in FIG. 17, are located at a distance from the light axis of a photographic lens (not shown). Therefore, the pupil center of the photographic lens is located at a position shifted to the right, and the light flux enters a micro lens 2 at an angle from the right. Thus, the micro lens 2 is shifted to the right from the center of the pixel.

Further, in this embodiment, as is shown in FIG. 16, the angles of the slopes of a dichroic layer 4, which is the wavelength selection section, differ from each order ($\theta 1 \neq \theta 2$). In this structure, while the bottom faces of the quadrangular pyramids forming the dichroic layer 4 that is the wavelength selection section match boundaries 15 between the pixels 100, only vertexes 4P of the quadrangular pyramids are shifted to the right.

When, contrary to FIG. 16, the pupil center of the photographing lens is shifted to the left, the dichroic layer 4, which is the wavelength selection section, is deposited so that the vertexes 4P are shifted to the left. In this case also $\theta 1 \neq \theta 2$.

FIG. 17 is a diagram for explaining the wavelength selection section 4 provided for the image pickup element. The wavelength selection sections 4 located at the individual positions are enlarged and illustrated around the periphery of the image pickup element.

In the peripheral portion of the image pickup element, the shape of the dichroic layer 4, that is the wavelength selection section, is changed, so that the vertexes 4P are located closer to the center of the image pickup element than a center axis 3c determined by a photoelectric conversion section 3. That is, $\theta 1 \neq \theta 2$ is established for the slopes of the wavelength selection section 4, and the locations of the bottom faces of the dichroic layer 4 match the locations of the pixels.

An explanation will now be given for the movement of a light flux that entered at a view angle relative to the peripheral portion of the image pickup element according to the second embodiment.

FIG. 18 is a diagram showing the movement of a light flux that passes through the dichroic layer 4 that is the wavelength selection section. The light flux, which entered from above in FIG. 18, is transmitted to the micro lens 2 and is condensed. Then, the light is transmitted to a first refraction index layer 5 and a second refraction index layer 6, in this order, and reaches a dichroic layer 4g. The dichroic layer 4, which is the wavelength selection section, selectively passes only a light flux having a predetermined wavelength and transmits it to a first refraction rate portion 7. The light advances to a second refraction rate portion 8, and is repetitively, fully reflected by the interface between the second refraction rate portion 8 and a third refraction rate portion 9. Through this process, the light is guided to the photoelectric conversion section 3. Since the interface between the second refraction rate portion 8 and the third refraction rate portion 9 is tapered with the incident portion being spread, the light can also be fully reflected at the tapered face, and can be guided to the photoelectric conversion section 3.

FIG. 19 is a diagram showing the movement of a light flux that enters a pixel $100_{i,j}g$ which receives green light, and is reflected by the dichroic layer 4g, i.e., the movement only of a light flux that includes blue light and red light. The light flux output from the pupil of the photographing lens, which is located at an appropriate distance in accordance with the pixel size, is passed through an infrared cut filter and becomes an object light flux 120. The object light flux 120, which entered from above in FIG. 19, is transmitted to the micro lens 2 and is condensed. The resultant light 120 is then enters the first refraction index layer 5 and the second refraction index layer 6 in this order, and reaches the dichromic film 4g. At this time, the light flux other than green light is reflected in accordance with the characteristic of the dichroic layer 4 that is deposited on the faces forming the quadrangular pyramid. Since the deposited dichroic layer 4 is formed in a quadrangular pyramid shape, the reflected light flux is advanced while the direction is changed outward from the center.

Further, from among the light reflected on the dichroic layer 4, the light flux having a critical angle or more is fully reflected by the interface between the second refraction index layer 6 and the first refraction index layer 5. The light flux, which is again directed downward, advances to the adjacent pixels $100_{i,j}r$ and $100_{i+1,j}r$ that receive red light. The light flux passing through the dichroic layer 4r is transmitted to the first refraction rate portion 7 and the second refraction rate portion 8, in this order. Following this, the light is transmitted from the second refraction rate portion 8 to the third refraction rate portion 9, and at this time, since as is described above the second refraction rate portion 8 has a higher refraction rate than the third refraction rate portion 9, the light flux having the critical angle or more is fully reflected at the interface. Since the interface between the second refraction rate portion 8 and the third refraction rate portion 9 is tapered with the light incident portion being spread, the area size for fetching the incident light flux is extended, so that a large amount of light flux can be obtained at the second refraction rate portion 8. Further, since the interface near the photoelectric conversion section 3 is formed of two faces, substantially parallel to the perpendicular direction, the light flux that is fully reflected the first time and does not enter the photoelectric conversion section is fully reflected again at the opposite interface. Thus, finally, all of the light flux enters the photoelectric conversion section 3.

According to the structure in this embodiment, the shape of the dichroic layer 4, which is the wavelength selection section, is changed, so that the vertexes 4P of the dichroic layer 4 are located closer to the center of the image pickup element than the center axis 3c determined by the photoelectric conversion section 3. That is, θ1≠θ2 is established for the wavelength selection section 4, and the locations of the bottom faces of the dichroic layer 4 match the locations of the pixels.

Therefore, the angles of the light fluxes entering and proceeding to the right slope and to the left slope of the wavelength selection section 4 can be adjusted, and the light fluxes reflected at the right slope and the left slope enter at appropriate angles the interface between the first refraction index layer 5 and the second refraction index layer 6.

As a result, in the pixels in the peripheral portion of the image pickup element, a light flux having a larger view angle can be received from the photographic lens (not shown).

In this embodiment, the angle formed by the first direction and the second direction for arranging the pixels 100 is a right angle. However, the pixels 100 may be arranged to form a honeycomb-like structure, i.e., an angle formed by the first direction and the second direction may be 60 degrees, or another angle may be employed. Furthermore, the pixels 100 may be arranged one-dimensionally.

While the dichroic layer 4 in this embodiment, which is the wavelength selection section, is shaped like a quadrangular pyramid, another polygonal pyramid, such as a hexagonal pyramid or an octagonal pyramid, may be employed.

Third Embodiment

Figure 20:
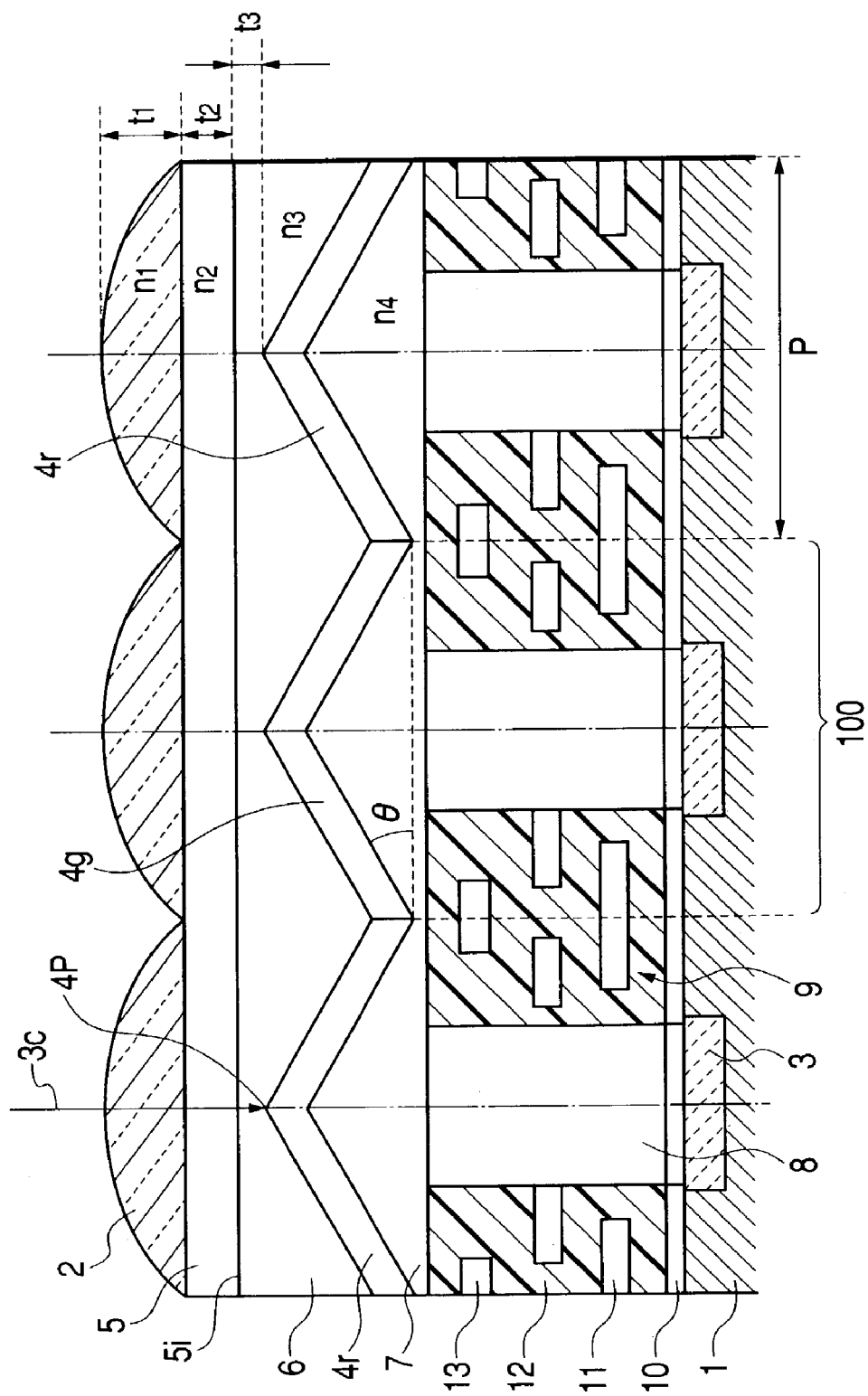
FIG. 20 is a specific cross-sectional view of part of an image pickup apparatus according to a third embodiment of the present invention.

FIG. 20 is a specific cross-sectional view of part of an image pickup element according to a third embodiment of the present invention. In FIG. 20, each element portion 100 includes: a micro lens 2 which condenses an external light flux to improve the efficiency of the acquisition of the light flux; a dichroic layer 4 (4r and 4g) which is a wavelength selection section for splitting a light flux in accordance with the wavelength; a first refraction index layer 5; a second refraction index layer 6; an interface 5i between the first refraction index layer 5 and the second refraction index layer 6; a first refraction rate portion 7; a second refraction rate portion 8; a third refraction rate portion 9; a Poly wiring layer 10 which serves as a gate for controlling the charges produced by a photoelectric conversion section 3; an AL1 wiring layer 11 which serves as a connecting line between the individual sections and an output line; an AL2 wiring layer 12 which serves as a well power source and a control line; an AL3 wiring layer 13 which serves as a light shielding layer and a power source line; the photoelectric conversion section 3 which is formed under the Poly wiring layer 10 to convert a light signal into an electric signal; and a silicon wafer 1 in which the photoelectric conversion section 3 is formed.

In FIG. 20, $n_1$ denotes the refraction rate of the micro lens 2 and $t_1$ denotes the height of the micro lens 2; $n_2$ denotes the refraction rate of the first refraction index layer 5, and $t_2$ denotes the thickness of the first refraction index layer 5; $n_3$ denotes the refraction rate of the second refraction index layer 6, and $t_3$ denotes the distance between a vertex 4P of the dichroic layer 4 and the interface 5i between the first refraction index layer 5 and the second refraction index layer 6; θ denotes the angle of a slope of the dichroic layer 4; and P denotes the size (pitch) of one element portion.

The element portions 100 are arranged at angles of 90 degrees, for example, or at 60 degrees like a honeycomb structure.

The micro lens 2 has a spherical shape and is upward convex, and has a positive lens power.

The first refraction index layer 5 is made of a material having a low refraction rate, such as magnesium fluoride ($MgF_2$) which has a refraction rate of 1.38.

The second refraction index layer 6 is made of a material having a high refraction rate, such as titanium dioxide ($TiO_2$) which has a refraction rate of 2.5.

Therefore, the light flux advancing from the second refraction index layer 6 to the first refraction index layer 5 tends to be fully reflected at the interface 5i.

The third refraction rate portion 9 is made of a material having a low refraction rate, such as silicon dioxide ($SiO_2$) which has a refraction rate of 1.46, or magnesium fluoride.

Thus, since the light flux that enters the second refraction rate portion 6 is easily, fully reflected at the interface with the third refraction rate portion 9, and the light guide path extended to the photoelectric conversion section 3 can be provided.

Since full reflection of the light must be prevented at the interface between the second refraction rate portion 8 and the first refraction rate portion 7, the first refraction rate portion 7 is formed of a material having the same refraction rate as or lower than the second refraction index layer 6. However, since it is preferable that the difference in the refraction rate from that of the second refraction index layer 6 be small, a silicon nitride (SiN) which has a refraction rate of 2.0, for example, can be employed.

Since the dichroic layer 4 is deposited on the faces of the quadrangular pyramid shape, the reflected light flux advances in different directions outward from the center.

Generally, the dichroic layer 4 is deposited with a thickness of an integer times ¼ of a target wavelength λ by alternately laminating a material having a high refraction rate and a material having a low refraction rate. With this structure, the wavelength of the transmitted light flux can be selected.

FIG. 24 is a diagram showing example thicknesses for the dichroic layer 4 in FIG. 20. Titanium dioxide is employed as a material having a high refraction rate, and silicon dioxide is employed as a material having a low refraction rate. These layers, having the thicknesses shown in FIG. 24, are easily deposited and stacked using the physical vapor deposition (PVD) method.

Figure 25:
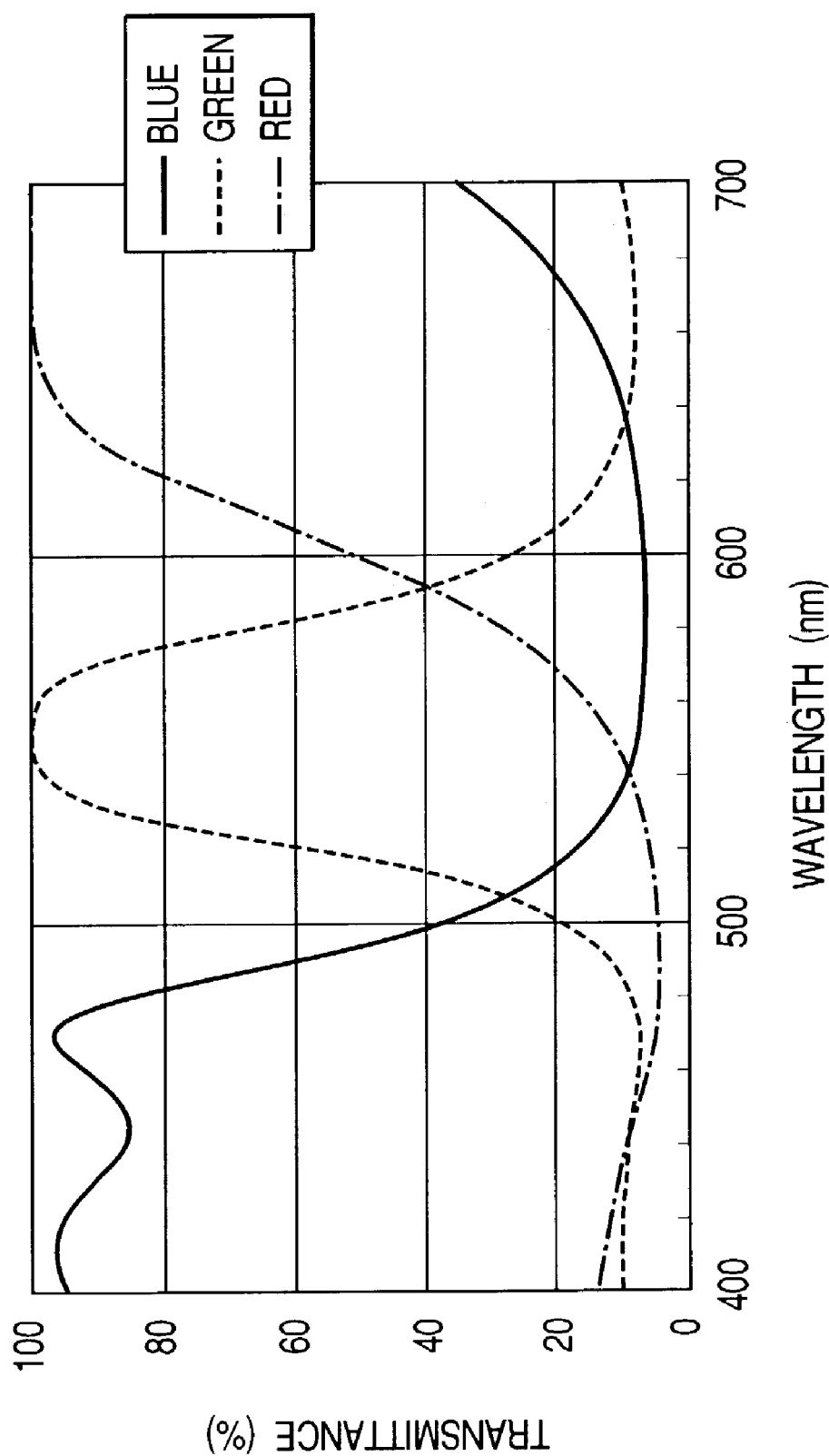
FIG. 25 is a graph showing the transmittance characteristic of the dichroic layer in FIG. 24.

FIG. 25 is a graph showing the transmittance characteristic of the dichroic layer 4 in FIG. 24. As is shown in FIG. 24, the characteristic of the dichroic layer 4 in FIG. 24 is similar to that of the characteristic of a color filter using color elements.

Therefore, the amount of light reaching the photoelectric conversion section 3 is the same, regardless of whether the dichroic layer 4 or the color filter is employed.

The light path in the image pickup element in this embodiment will now be described.

First, an explanation will be given for a light flux to be transmitted through the dichroic layer 4. Light emitted to the image pickup apparatus is converted into a light flux 120 by a photographic lens (not shown), and the light flux 120 enters the micro lens 2 to be condensed. Then, the condensed light is transmitted to the first refraction index layer 5 and the second refraction index layer 6, in this order, and reaches the dichroic layer 4g.

Since the dichroic layer 4g selectively passes only a light flux having a predetermined wavelength, the light that has reached the dichroic layer 4 is transmitted to the first refraction rate portion 7. Then, the light advances to the second refraction rate portion 8, and repetitively, is fully reflected at the interface with the third refraction rate portion 9 and the resultant light is finally guided to the photoelectric conversion section 3. Now, an explanation will be given for the light flux to be reflected at the dichroic layer 4.

Figure 21:
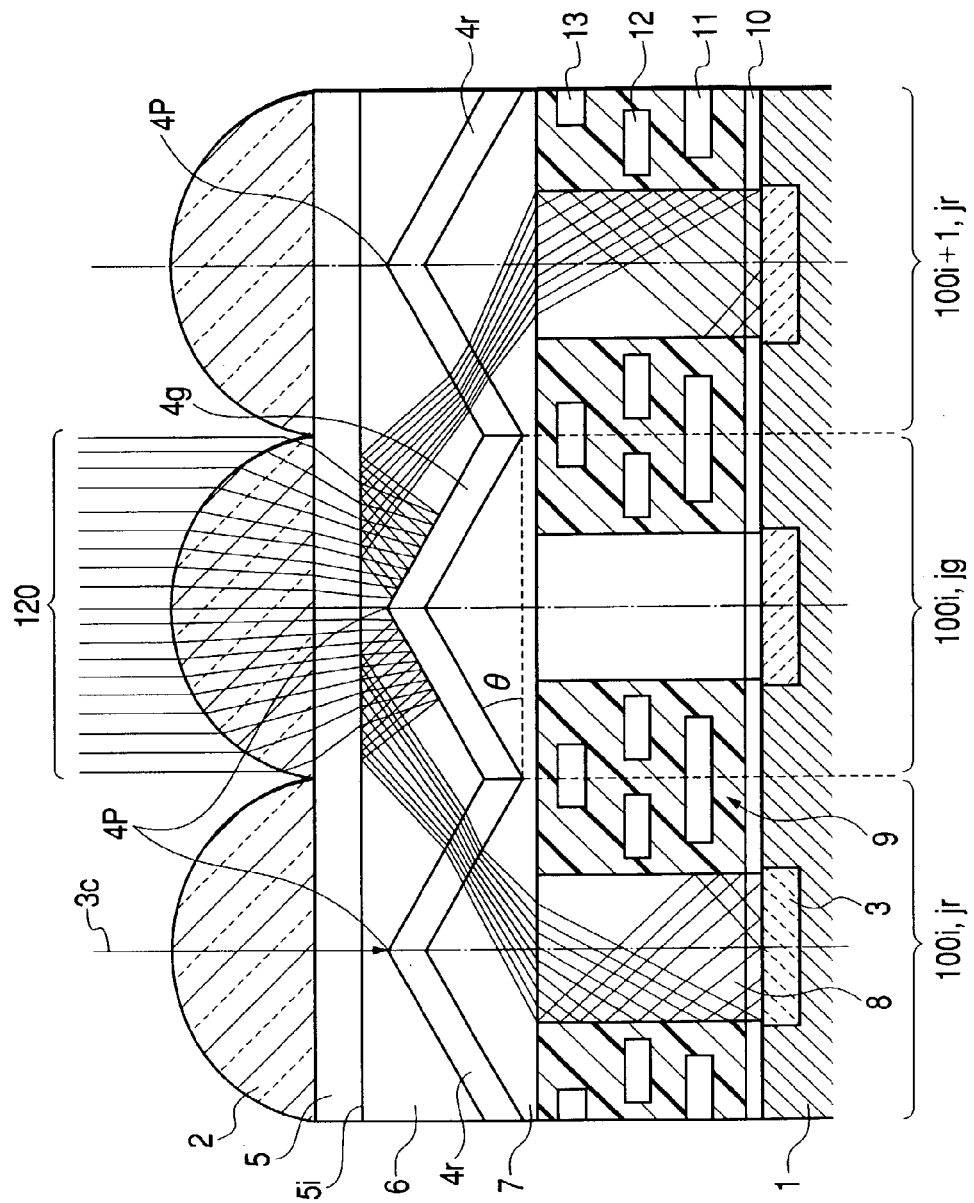
FIG. 21 is a diagram showing optical paths in the image pickup apparatus in FIG. 20 when it is irradiated by light.

FIG. 21 is a diagram showing a path for light that has been emitted to the image pickup element in FIG. 20 and is reflected by the wavelength selection section in the image pickup element. The same reference numerals as are used in FIG. 20 are used to denote corresponding components in FIG. 21.

The procedures performed until the light reaches the dichroic layer 4g are the same as those for the transmitted light. Out of a light flux incident to the dichroic layer 4g, light other than green light, i.e, red light and blue light are reflected by the dichroic layer 4g.

As is described above, since the second refraction index layer 6 has a higher refraction rate than the first refraction index layer 5, the light flux having a critical angle or greater is fully reflected at the interface 5i. The light flux fully reflected at the interface 5i advances to the element portions $100_{i,j}r$ and $100_{j+1,j}r$ that are adjacent in the direction of the dichroic layer 4r and that receive red light.

The dichroic layer 4r for the element portions $100_{i,j}r$ and $100_{j+1,j}r$ transmits the red light and reflects green light and blue light. Therefore, of the light flux reflected by the element portion $100_{i,j}g$, only red light is passed through, and blue light is reflected by the dichroic layer 4r.

Since the blue light that is reflected advances in the direction perpendicular to the surface of the paper, in this embodiment, the blue light advances toward an element portion adjacent to the element portion $100_{i,j}g$ in the direction perpendicular to the paper face. The dichroic layer 4r that passes the reflected light flux has a light transmission dimension that is smaller by a size equivalent to the film thickness. And, the dimension of the light flux (dimension of the reflected light) that enters the dichroic layer 4g is reduced by the condensing function of the micro lens 2, compared with the opening size of the micro lens 2.

Therefore, the reflected light flux is passed through the dichroic layer 4r and advances to the first refraction rate portion 7 and the second refraction rate portion 8, in this order. Then, the light advances from the second refraction rate portion 8 to the third refraction rate portion 9. In this case, as is described above, since the second refraction rate portion 8 has a higher refraction rate than the third refraction rate portion 9, a light flux having a critical angle or greater is fully reflected at the interface.

Furthermore, since this interface is formed of two faces substantially parallel in the perpendicular direction, the light flux that is fully reflected the first time and does not enter the photoelectric conversion section 3 is fully reflected again at the interface on the opposite side. Finally, all the light flux is transmitted to the photoelectric conversion section 3.

An element portion for receiving blue light exists in the element portion $100_{i,j}g$ perpendicular to the paper face. In the same manner as for the red light, of a light flux reflected by the element portion $100_{i,j}g$, only blue light is captured.

In this embodiment, the micro lens 2 is so designed that light reflected at the dichroic layer 4 can be guided to the photoelectric conversion section 3. For this configuration, the following conditions are required.

Condition 1

Light fully reflected at the interface 5i between the first refraction index layer 5 and the second refraction index layer 6 should again enter the dichroic faces of adjacent element portions.

This condition is determined in accordance with a slope angle θ of the dichroic layer 4, and a distance $t_3$ between the vertex 4P of the dichroic layer 4 and the interface 5i.

Figure 22:
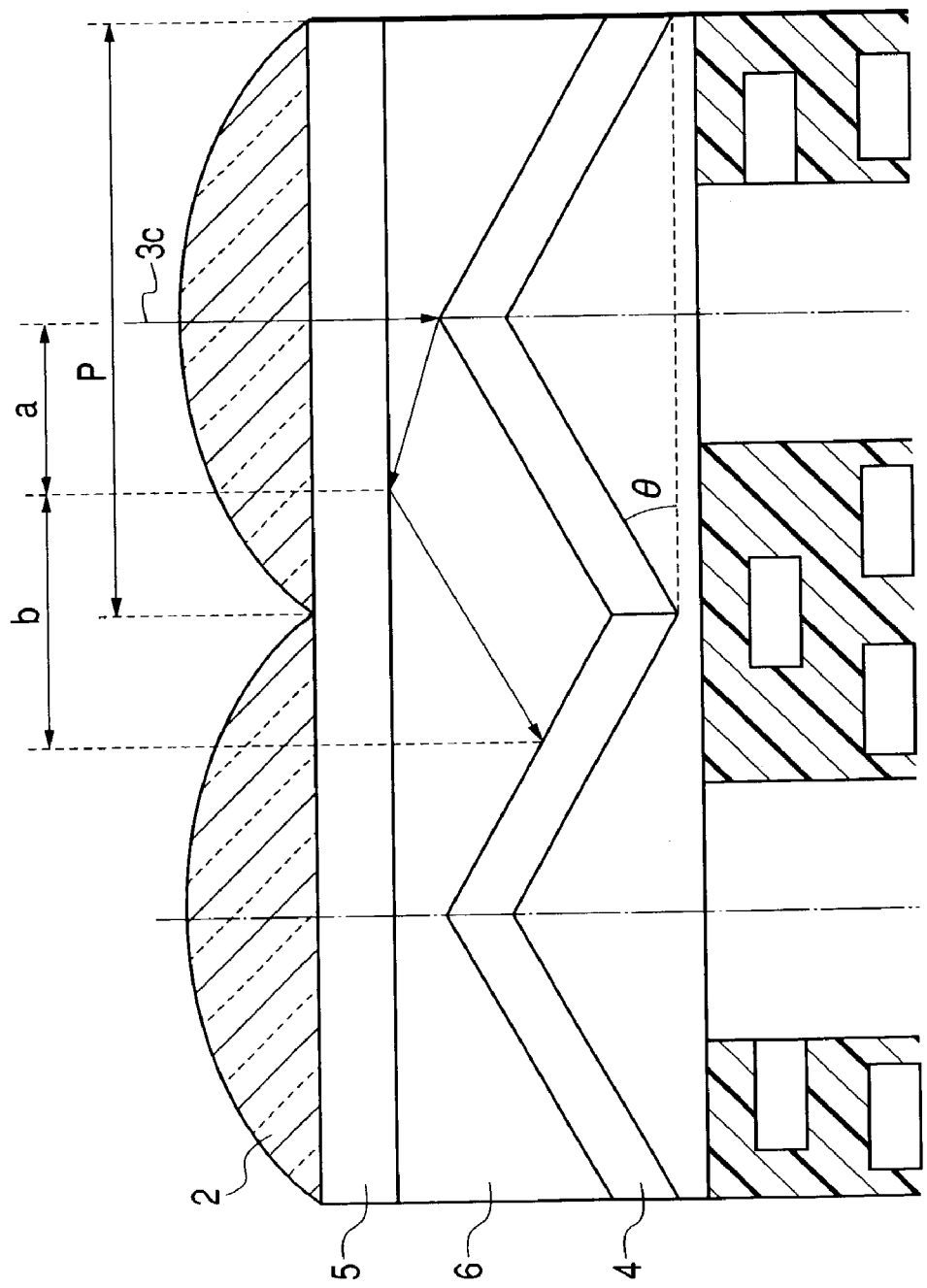
FIG. 22 is an enlarged diagram showing a portion near a dichroic layer in FIG. 20.

FIG. 22 is an enlarged diagram showing the vicinity of the dichroic layer 4 in FIG. 20. As is shown in FIG. 22, assume that a denotes a horizontal distance travelled before the light reflected at the dichroic layer 4 reaches the interface 5i, and b denotes a horizontal distance traveling until the light reflected at the interface 5i reaches an adjacent dichroic layer segment. When $$\frac{P}{2} \leq a + b \leq P \quad (1)$$

is satisfied, the light reflected at the dichroic layer 4 is fully reflected at the interface 5i and then again enters the adjacent dichroic face. Thus, condition 1 is established.

Therefore, when for a and b in expression (1) are substituted $t_3$, P and θ, and equation (1) is solved for $t_3$, $$\frac{P}{4}\left(\frac{1}{\tan 2\theta} - \tan\theta\right) \leq t_3 \leq \frac{P}{4}\left(\frac{2}{\tan 2\theta} - \tan\theta\right) \quad (2)$$

is obtained, and the relationship expressed in equation (3) need only be established for $t_3$ and θ.

Condition 2

The width of a light flux which reenters is narrowed in the vicinity of the dichroic layer (wavelength selection section) 4. That is, the location whereat the light flux is passed through the micro lens 2 is in the vicinity of the wavelength selection section 4.

When $r_1$ denotes the curvature of the micro lens 2, and f denotes a focal distance, $$r_1 \cong \frac{4t_1^2 + P^2}{8t_1} \text{ and} \quad (3)$$

$$\frac{1}{f} = \frac{n_1 - 1}{r} \quad (4)$$

are established. Thus, in accordance with expressions (3) and (4), $$f \cong \frac{4t_1^2 + P^2}{8t_1(n_1 - 1)} \quad (5)$$

is obtained.

In addition, the length of a light path is calculated by the refraction rate of the micro lens 2 and the thickness and the refraction rate of each refraction index layer, and is substituted into expression (5). Then, the obtained height of the micro lens 2 is as follows:

$$t_1 = \frac{d \pm \sqrt{d^2 - cP^2}}{c} \quad \text{where} \tag{6}$$

$$c = \frac{8 - 4n_1}{n_1} \tag{7}$$

$$d = 4(n_1 - n_2)\left\{\frac{t_2}{n_2} + \frac{(t_3 + mP/\sin2\theta)}{n_3}\right\} \tag{8}$$

In this case, m denotes a coefficient that is used to provide redundancy for the length of a light path, and that is a value for satisfying $\frac{1}{2} \leq m \leq \frac{5}{4}$. Since the refraction rate $n_4$ of the refraction index layer (i.e., the first refraction index layer 7) after the light reenters the wavelength selection section 4 does not greatly differ from the refraction rate $n_3$, $n_4$ is replaced with $n_3$ in expression (8).

For example, in the structure with P=7.4 μm and θ=28°, $t_3$ is obtained as $t_3$=0.5 μm by using expression (2) for the condition 1, or when m=1, based on the condition 2, $t_1$=3.14 μm is obtained.

As is shown in FIG. 21, when the curvature of the micro lens 2 is defined so that the location whereat the reflected light is condensed is in the vicinity of the wavelength selection section 4, the reflected light can be efficiently guided to the photoelectric conversion section 3.

Fourth Embodiment

Figure 23:
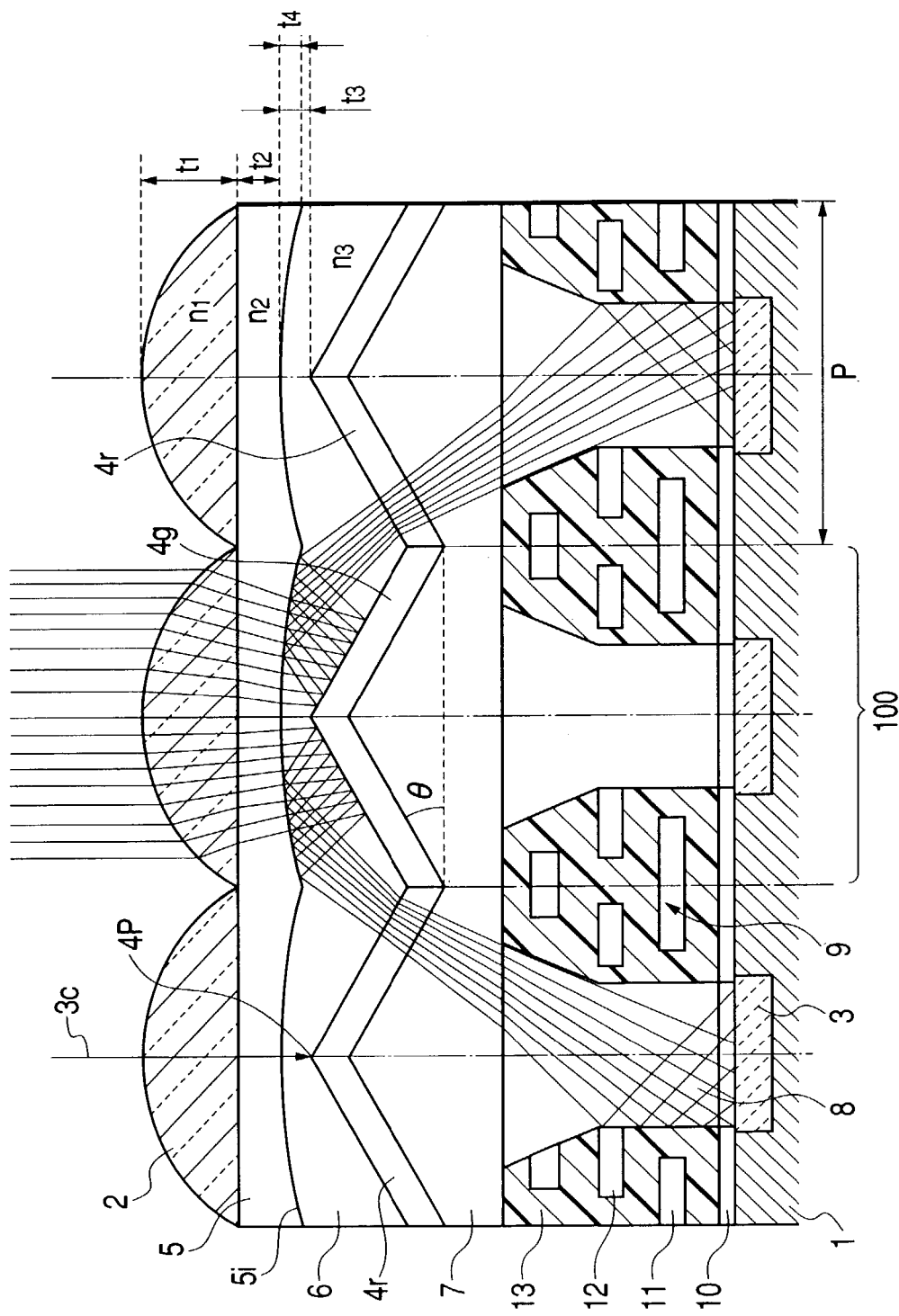
FIG. 23 is a specific cross-sectional view of part of an image pickup apparatus according to a fourth embodiment of the present invention.

FIG. 23 is a specific cross-sectional view of a part of an image pickup element according to a fourth embodiment of the present invention. In FIG. 23, the same reference numbers as are used in FIG. 20 are also employed to denote corresponding components.

In this embodiment, an interface 5i is formed in a spherical shape raised opposite the photoelectric conversion section 3.

Further, assume that $n_1$ denotes the refraction rate of a micro lens 2; $t_1$ denotes the height of the micro lens 2; $n_2$ denotes the refraction rate of a first refraction index layer 5; $t_2$ denotes the thickness of the first refraction index layer 5 along a center axis 3c determined by the photoelectric conversion section 3; $n_3$ denotes the refraction rate of a second refraction index layer 6; $t_3$ denotes the distance between the interface 5i and a vertex 4P of a dichromic film 4; and $t_4$ denotes the height of the interface 5i. Further, assume that the refraction rate n1 of the first refraction index layer 5 is greater than the refraction rate n3 of the second refraction index layer 6.

In the image pickup element of the embodiment, of a light flux that has entered a dichroic layer 4g, light other than green light, i.e., red light and blue light are reflected by the dichroic layer 4g, and then fully reflected at the spherical face 5i and transmitted to a dichroic layer 4r of an adjacent element portion. Of the light flux that enters the dichroic layer 4r, red light is passed through the dichroic layer 4r and is transmitted to the photoelectric conversion section 3 through a first refraction rate portion 7 and a second refraction rate portion 8.

Although not shown in FIG. 23, of a light flux that enters the dichroic layer 4g, light other than green light is passed through the dichroic layer 4g and reaches the photoelectric conversion section 3.

Also although not shown, of the light flux that enters the dichroic layer 4r, light other than red light is reflected at the dichroic layer 4r, and the reflected light is fully reflected at the spherical face 5i and is transmitted to a dichroic layer 4g of an adjacent element portion.

Of the light flux that enters the dichroic layer 4g, green light is passed through the dichroic layer 4g and is transmitted to the photoelectric conversion section 3 through the first refraction rate portion 7 and the second refraction rate portion 8.

As is described above, according to the image pickup element of this embodiment, of the light that enters the element portion 100, light having an unnecessary wavelength is guided to the photoelectric conversion section 3 of an adjacent element portion 100, so that the light usage efficiency can be improved.

Furthermore, for example, the relationship $0 < t_4 \leq t_3$ is established for the height $t_4$ of the interface 5i, whereat the light flux having a wavelength other than the green light reflected at the dichroic layer 4g is fully reflected, so that the light flux fully reflected at the interface 5i appropriately enters the dichroic layer 4r of an adjacent element portion 100.

In addition, while the interface 5i applies negative power to the light flux that is passed through the micro lens 2 and the spherical face 5i, the interface 5i applies, as a recessed-face mirror, positive power to the light flux that is passed through the spherical face 5i and is reflected at the dichroic layer 4.

Therefore, when the light flux reflected at the dichroic layer 4 is to be condensed in the vicinity of the dichroic layer 4 of an adjacent element portion 100, the power of the micro lens 2 can be reduced, and accordingly, the height $t_1$ of the micro lens 2 can be reduced. Thus, the manufacturing of the micro lens 2 can be simplified.

For the image pickup element in FIG. 23, when the height $t_4$ of the interface 5i is set to 0.4 μm ($\leq t_3$=0.5 μm), the height $t_1$ of the micro lens 2 is 2 μm. In the third embodiment, since $t_4$=0, i.e., the interface 5i is flat, the height $t_1$ of the micro lens 2 is high, i.e., 3.14 μm.

Whereas, in the fourth embodiment, since the interface 5i is formed in an upward convex spherical shape, the height $t_1$ of the micro lens 2 can be reduced. Further, even with such a low micro lens 2, the light flux that enters the image pickup element and is then reflected, can be condensed in the vicinity of the dichroic layer 4 of the adjacent element portion 100.

Fifth Embodiment

While referring to FIG. 26, an explanation will now be given for an image pickup apparatus that employs an image pickup element having the configuration described for the first embodiment or the fourth embodiment.

Figure 26:
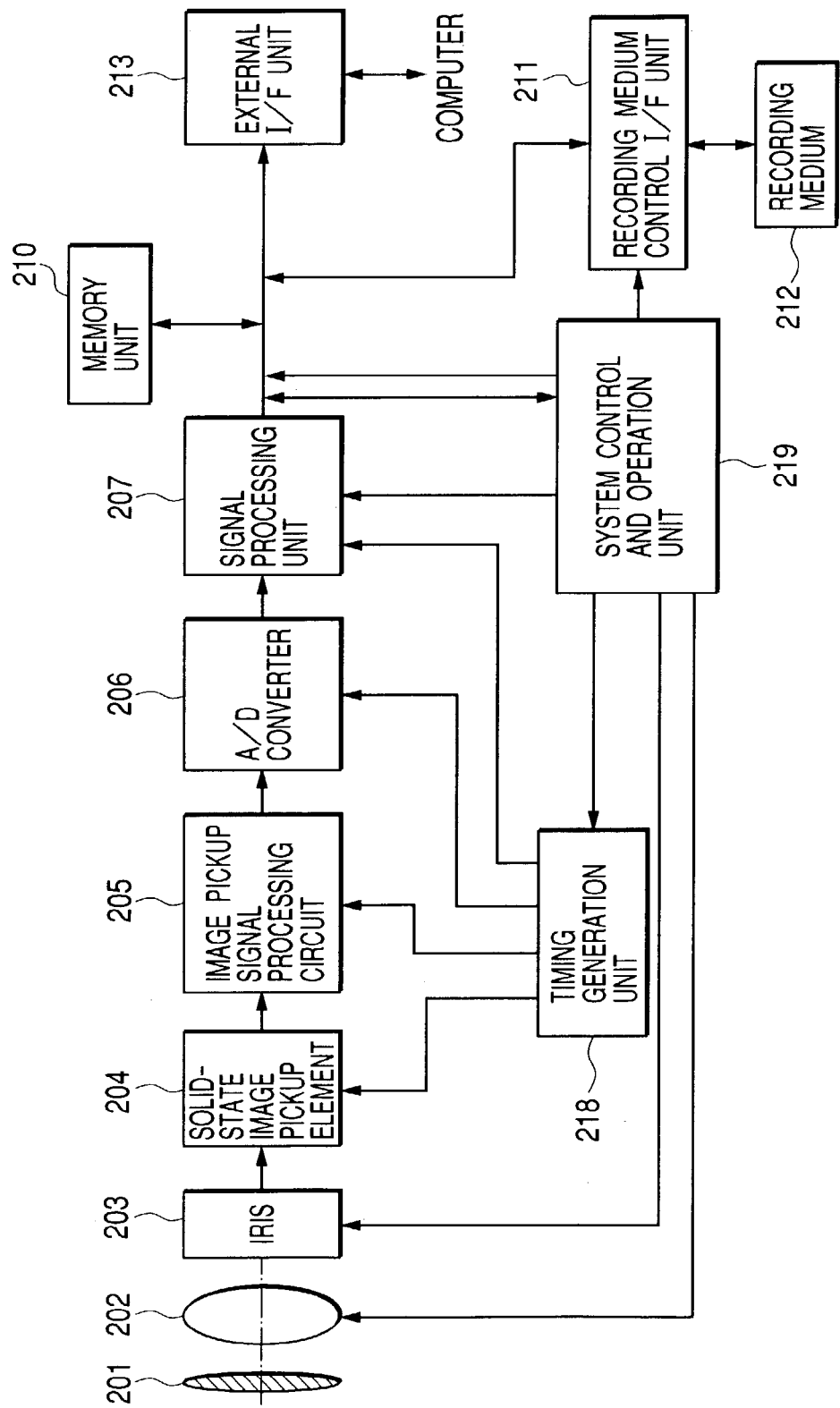
FIG. 26 is a diagram showing a fifth embodiment of the present invention.
Figure 27:
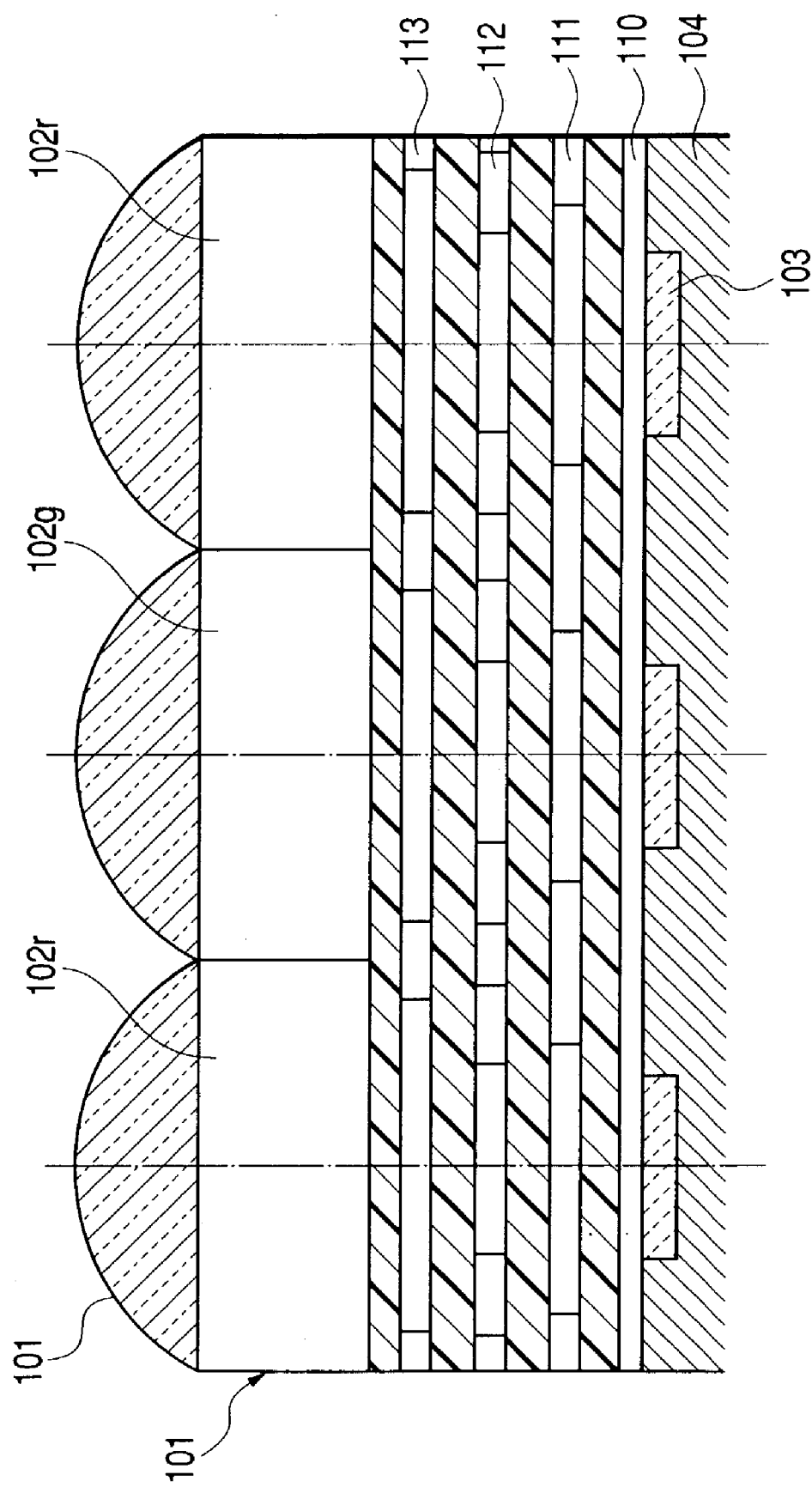
FIG. 27 is a diagram showing the structure of a conventional image pickup element.

In FIG. 26, the image pickup apparatus comprises: a barrier 201 which serves as a protector for a lens and as a main switch; a lens 202 for forming the optical image of an object; an iris 203 for varying the amount of light passed through the lens 202; a solid-state image pickup element 204 for capturing as an image signal the image of an object formed by the lens 202; an image pickup signal processing circuit 205 including a gain variable amplifier for amplifying the image signal received from the solid-state image pickup element 204 and a gain correction circuit for correcting a gain value; an A/D converter 206 for performing analog/digital conversion for the image signal output by the solid-state image pickup element 204; a signal processing unit 207 for performing various corrections for image data output by the A/D converter 206 or for compressing the data; a timing generation unit 208 for outputting various timing signals to the image pickup element 204, the image pickup signal processing circuit 205, the A/D converter 206 and the signal processing unit 207; a system control and operation unit 209 for performing various operations and for providing overall control for the image pickup apparatus; a memory unit 210 for temporarily storing the image data; a recording medium control interface unit 211 for recording data to or reading data from a recording medium; a detachable recording medium 212, such as a semiconductor memory, for the recording or reading of image data; and an interface 213 for communicating with an external computer.

The photographic operation of the thus arranged image pickup apparatus will now be described.

When the barrier 201 is opened, the main power switch is turned on, and then the control system and the photographic system circuits, such as the A/D converter 206, are powered on.

In order to control the amount of light exposure, the system control and operation unit 209 opens the iris 203, and a signal output by the image pickup element 204 is converted by the A/D converter 206 and the obtained signal is transmitted to the signal processing unit 207.

Based on the obtained data, the system control and operation unit 209 performs an exposure operation. Based on the photometric results, the system control and operation unit 209 determines the brightness, and controls the iris 203 in accordance with the brightness.

Following this, the system control and operation unit 209 extracts a high frequency component from the signal output by the image pickup element 204, and calculates the distance to the object. Thereafter, the system control and operation unit 209 drives the lens 202 to determine whether the object is in focus. When it is ascertained that the object is not in focus, the system control and operation unit 209 drives the lens 202 to measure the distance.

When it is ascertained that the object is in focus, the primary exposure process is performed.

When the exposure is completed, the A/D converter 206 performs an A/D conversion for the image signal output by the image pickup element 204, and transmits the obtained signal to the signal processing unit 207. The system control and operation unit 209 then writes the signal to the memory unit 210. Thereafter, under the control of the system control and operation unit 209, the data stored in the memory unit 210 are transmitted through the recording medium control I/F unit 211, and are recorded to the detachable recording medium 212, such as a semiconductor memory.

The data may be directly transmitted to a computer through the external I/F unit 213 to perform image processing.

Many widely different embodiments of the present invention may be constructed without departing from the spirit and scope of the present invention. It should be understood that the present invention is not limited to the specific embodiments described in the specification, except as defined in the appended claims.

What is claimed is:

1. An image pickup apparatus in where a micro lens condenses light from an object and a photoelectric conversion section receives the condensed light and converts the received light into an electric signal to obtain an image of the object, comprising:

a wavelength selection section, located between the micro lens and a refraction section, which selectively transmits of light having a predetermined wavelength and reflects light having another wavelength; and a reflection section, located between the micro lens and the refraction section, for directing light reflected by the wavelength selection section toward an adjacent photoelectric conversion section, wherein light reflected by the reflection section forms an image on the wavelength selection section, and wherein a height of the micro lens, a distance between a vertex of the wavelength selection section and a reflection face of the reflection section, a slope angle of the wavelength selection section relative to the photoelectric conversion section, and a pitch of the photoelectric conversion section are adjusted so that an image is formed on the wavelength selection section by light reflected by the reflection section.

* * * * *

UNITED STATES PATENT AND TRADEMARK OFFICE
CERTIFICATE OF CORRECTION

| | |
|---|---|
| PATENT NO. | : 7,245,324 B2 |
| APPLICATION NO. | : 10/375170 |
| DATED | : July 17, 2007 |
| INVENTOR(S) | : Eriko Namazue et al. |

Page 1 of 1

It is certified that error appears in the above-identified patent and that said Letters Patent is hereby corrected as shown below:

ON COVER PAGE AT (56) FOREIGN PATENT DOCUMENTS

"JP  03152971  A  6/1991" should be deleted; and
"JP  2001237405  A  8/2001" should be deleted.

Signed and Sealed this

Thirteenth Day of May, 2008

JON W. DUDAS
*Director of the United States Patent and Trademark Office*